(12) United States Patent
Naito et al.

(10) Patent No.: US 10,827,658 B2
(45) Date of Patent: Nov. 3, 2020

(54) ELECTRONIC DEVICE HOUSING, METHOD FOR MANUFACTURING ELECTRONIC DEVICE HOUSING, DEVELOPMENT PLAN-SHAPED METAL RESIN JOINT PLATE, AND ELECTRONIC APPARATUS

(71) Applicant: MITSUI CHEMICALS, INC., Tokyo (JP)

(72) Inventors: Shinya Naito, Sodegaura (JP); Nobuyoshi Shimbori, Utsunomiya (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 16/326,897

(22) PCT Filed: Aug. 23, 2017

(86) PCT No.: PCT/JP2017/030129
§ 371 (c)(1),
(2) Date: Feb. 20, 2019

(87) PCT Pub. No.: WO2018/038159
PCT Pub. Date: Mar. 1, 2018

(65) Prior Publication Data
US 2019/0191598 A1 Jun. 20, 2019

(30) Foreign Application Priority Data

Aug. 26, 2016 (JP) .................................. 2016-165527
Jan. 24, 2017 (JP) .................................. 2017-010265

(51) Int. Cl.
*H05K 9/00* (2006.01)
*H05K 5/04* (2006.01)
(Continued)

(52) U.S. Cl.
CPC ............. *H05K 9/0049* (2013.01); *B21D 5/16* (2013.01); *B29C 45/14467* (2013.01);
(Continued)

(58) Field of Classification Search
CPC ......................... H05K 9/0026; H05K 9/0045
See application file for complete search history.

(56) References Cited

U.S. PATENT DOCUMENTS

2002/0021549 A1    2/2002  Kono et al.
2004/0240192 A1*  12/2004  Seidler ................. H05K 9/0026
                                                                361/816

FOREIGN PATENT DOCUMENTS

JP         2016-103521     *  6/2016     ............... H05K 9/00

OTHER PUBLICATIONS

Machine Translation for JP 2016-103521, 13 pages, translated on Oct. 25, 2019 (Year: 2019).*

(Continued)

*Primary Examiner* — Hung V Ngo
(74) *Attorney, Agent, or Firm* — Foley & Lardner LLP

(57) ABSTRACT

An electronic device housing of the present invention is a housing for internally accommodating an electronic device and is provided with a metal bottom plate, and metal side plates folded and integrally connected to the bottom plate, in which, in a metal member (M) formed of at least the bottom plate and the side plate, a thermoplastic resin member is joined to a portion of the surface of the plate-shaped metal member (M), the metal member (M) is reinforced by a thermoplastic resin member, and the thermoplastic resin member is joined to both surfaces of the plate-shaped metal member (M).

14 Claims, 9 Drawing Sheets

(51) Int. Cl.
  *H05K 5/02*    (2006.01)
  *B21D 5/16*    (2006.01)
  *B29C 45/14*   (2006.01)
  *B29K 101/12*  (2006.01)
  *B29K 701/12*  (2006.01)
  *B29K 705/00*  (2006.01)
  *B29L 31/34*   (2006.01)

(52) U.S. Cl.
  CPC ............... *H05K 5/02* (2013.01); *H05K 5/04* (2013.01); *H05K 9/00* (2013.01); *H05K 9/0045* (2013.01); *H05K 9/0081* (2013.01); *B29K 2101/12* (2013.01); *B29K 2701/12* (2013.01); *B29K 2705/00* (2013.01); *B29L 2031/34* (2013.01); *H05K 9/0041* (2013.01)

(56) References Cited

OTHER PUBLICATIONS

International Searching Authority, "International Search Report," issued in connection with International Patent Application No. PCT/JP2017/030129, dated Nov. 7, 2017.
International Searching Authority, "Written Opinion," issued in connection with International Patent Application No. PCT/JP2017/030129, dated Nov. 7, 2017.
Extended European Search Report dated Mar. 17, 2020 for corresponding European Patent Application No. 17843637.4.

\* cited by examiner

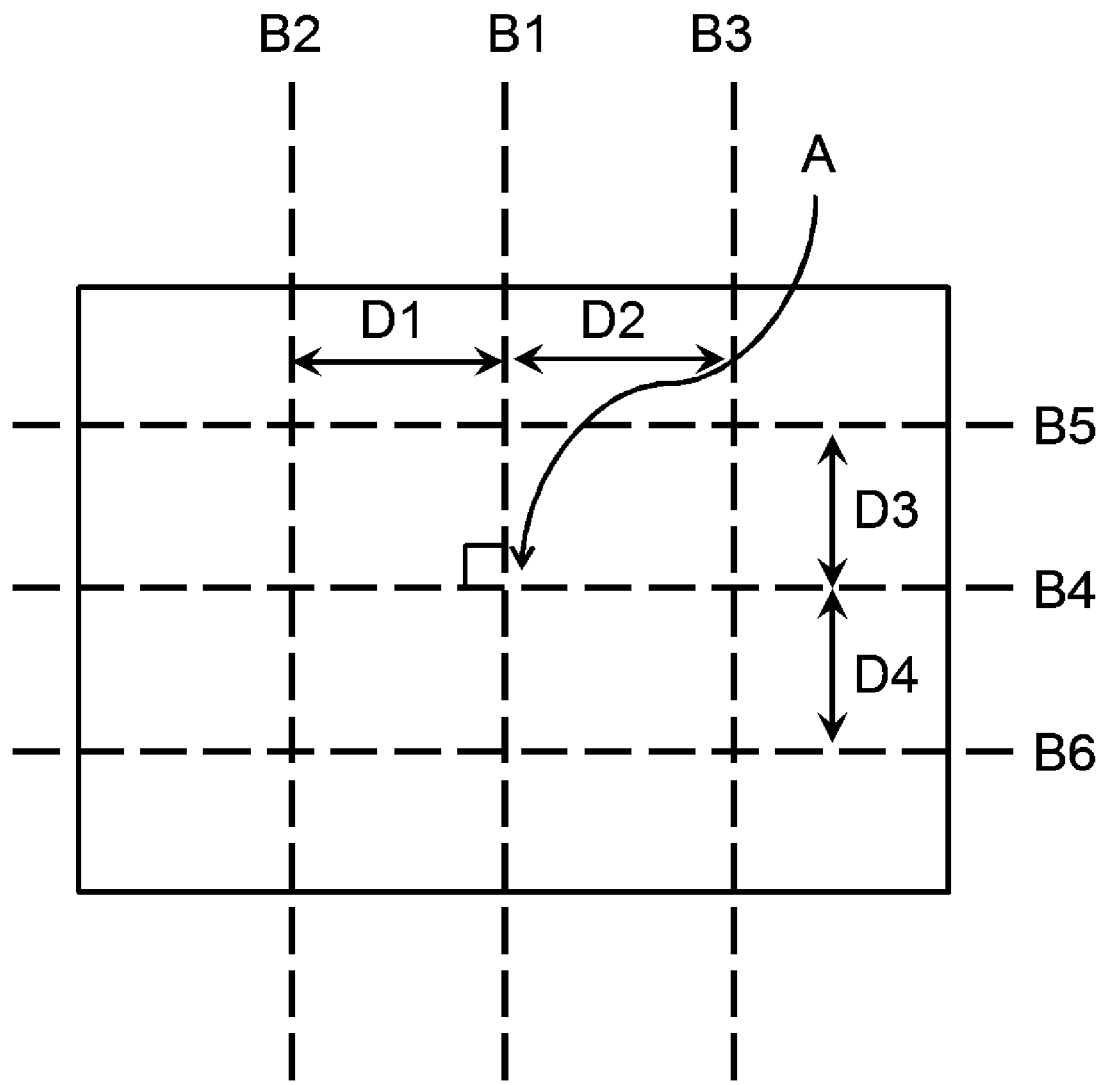

ELECTRONIC DEVICE HOUSING, METHOD FOR MANUFACTURING ELECTRONIC DEVICE HOUSING, DEVELOPMENT PLAN-SHAPED METAL RESIN JOINT PLATE, AND ELECTRONIC APPARATUS

RELATED APPLICATIONS

The present application claims priority under 37 U.S.C. § 371 to International Patent Application No. PCT/JP2017/030129, filed Aug. 23, 2017, which claims priority to and the benefit of Japanese Patent Application Nos. 2016-165527, filed on Aug. 26, 2016, and 2017-010265, filed on Jan. 24, 2017. The contents of these applications are hereby incorporated by reference in their entireties.

TECHNICAL FIELD

The present invention relates to an electronic device housing, a method for manufacturing an electronic device housing, a development plan-shaped metal resin joint plate, and an electronic apparatus.

BACKGROUND ART

As vehicles become more computerized and have higher performances, electronic devices using high-performance ICs generating large amounts of heat have come to be adopted as communication and information devices for vehicles, as represented by audio devices, vehicle-mounted mobile telephone devices, car navigation devices, and the like.

Meanwhile, it is necessary to suppress as much as possible malfunctions caused by electromagnetic waves, that is, electromagnetic interference (EMI), generated by these electronic devices. For this reason, a shielding method in which a shielding material of the housing accommodating the electronic device is formed of a highly conductive material (for example, zinc steel plate, copper foil, aluminum foil, or the like) and radio waves are reflected from the surface thereof is most widely adopted. Using such a shielding material also makes it possible to obtain the advantage that heat is easily dissipated in the device (refer to, for example, Patent Documents 1, 2, and 3).

RELATED DOCUMENT

Patent Document

[Patent Document 1] Japanese Unexamined Patent Publication No. 2002-176282
[Patent Document 2] Japanese Unexamined Patent Publication No. 2005-108328
[Patent Document 3] Japanese Unexamined Utility Model Registration Publication No. 5-72180

SUMMARY OF THE INVENTION

Technical Problem

Due to the recent trend toward lighter weight vehicles, there is also a demand for weight reduction in the electronic device housing mounted on a vehicle. For this reason, there is a strong demand from the industry for a lightweight housing for accommodating an electronic device which is provided with an electromagnetic wave shielding function and which has excellent heat dissipation characteristics and mechanical strength.

The present invention has been made in view of the above circumstances, and it is an object of the present invention to provide an electronic device housing which has an excellent balance between lightness, electromagnetic wave shielding property, heat dissipation characteristics, and mechanical strength.

Solution to Problem

The present inventors conducted intensive studies to achieve the above object. As a result, the present inventors found that using a metal member having an electromagnetic wave shielding function and a heat dissipation function as the main portion of an electronic device housing and strongly reinforcing portions of both surfaces of the metal member with a thermoplastic resin member makes it possible to replace a heavy metal member with a lightweight resin member in a portion of the electronic device housing while maintaining the electromagnetic wave shielding property, heat dissipation characteristics, and mechanical strength, and, as a result, that it is possible to obtain an electronic device housing which has a superior balance between lightness, electromagnetic wave shielding property, heat dissipation characteristics, and mechanical strength in comparison with housing of the related art in which the housing is entirely formed of a metal member, thereby completing the present invention.

That is, the present invention provides an electronic device housing, a method for manufacturing an electronic device housing, a development plan-shaped metal resin joint plate, and an electronic apparatus, which are illustrated below.

[1] An electronic device housing for internally accommodating an electronic device, the housing including a metal bottom plate, and a metal side plate folded and integrally connected to the bottom plate, in which, in a metal member (M) formed of at least the bottom plate and the side plate, a thermoplastic resin member is joined to a portion of a surface of the plate-shaped metal member (M) and the metal member (M) is reinforced by the thermoplastic resin member, and the thermoplastic resin member is joined to both surfaces of the plate-shaped metal member (M).

[2] In the electronic device housing according to [1], the metal member (M) has an average thickness of 0.2 mm or more and 1.0 mm or less.

[3] In the electronic device housing according to [1] or [2], the metal member (M) has a fine concavo-convex structure on at least a surface of a joined portion with the thermoplastic resin member, and the metal member (M) and the thermoplastic resin member are joined by allowing a portion of the thermoplastic resin member to penetrate into the fine concavo-convex structure.

[4] In the electronic device housing according to any one of [1] to [3], the thermoplastic resin member joined to one surface of the plate-shaped metal member (M) and at least a portion of the thermoplastic resin member joined to another surface are arranged to face each other in a vertical direction of a plate surface of the metal member (M).

[5] In the electronic device housing according to any one of [1] to [4], the thermoplastic resin member is joined to at least a peripheral edge portion of the surface of the metal member (M).

[6] In the electronic device housing according to any one of [1] to [5], at least a portion of the thermoplastic resin member is formed in a frame shape on the surface of the metal member (M).

[7] In the electronic device housing according to any one of [1] to [6], the thermoplastic resin member includes an injection molded body.

[8] In the electronic device housing according to any one of [1] to [7], the thermoplastic resin member has an average thickness of 1.0 mm or more and 10 mm or less.

[9] In the electronic device housing according to any one of [1] to [8], the metal material forming the metal member (M) includes a metal which has an electromagnetic wave shielding property.

[10] In the electronic device housing according to any one of [1] to [9], the housing further includes a metal lid plate folded and integrally connected to the side plate, in which the thermoplastic resin member is joined to a portion of a surface of the lid plate, and the lid plate is reinforced by the thermoplastic resin member.

[11] In the electronic device housing according to [10], the lid plate has a fine concavo-convex structure on at least a surface of a joined portion with the thermoplastic resin member, and the lid plate and the thermoplastic resin member are joined by allowing a portion of the thermoplastic resin member to penetrate into the fine concavo-convex structure.

[12] In the electronic device housing according to any one of [1] to [11], the thermoplastic resin member is not joined to a boundary linear portion between the bottom plate and the side plate.

[13] In the electronic device housing according to any one of [1] to [12], a surface area of the joined portion of the thermoplastic resin member occupied in an entire surface area of the metal member (M) is 1 area % or more and 50 area % or less.

[14] A development plan-shaped metal resin joint plate for manufacturing a housing for internally accommodating an electronic device, the development plan-shaped metal resin joint plate including a metal bottom plate, and a metal side plate folded and integrally connected to the bottom plate, in which, in a metal member (M) formed of at least the bottom plate and the side plate, a thermoplastic resin member is joined to a portion of a surface of the plate-shaped metal member (M), and the metal member (M) is reinforced by the thermoplastic resin member.

[15] A method for manufacturing the electronic device housing according to any one of [1] to [13], the method including a step (A) of preparing a development plan-shaped metal plate provided with a metal bottom plate and a metal side plate integrally connected to the bottom plate, and having a fine concavo-convex structure on at least a surface of a joined portion to which the thermoplastic resin member is joined; a step (B) of manufacturing a development plan-shaped metal resin joint plate by installing the development plan-shaped metal plate in a metal mold, injecting a thermoplastic resin composition into the metal mold, and joining the thermoplastic resin member to a surface of the development plan-shaped metal plate; and a step (C) of forming the development plan-shaped metal resin joint plate into a box shape by folding a boundary linear portion between the bottom plate and the side plate of the development plan-shaped metal resin joint plate.

[16] In the method for manufacturing the electronic device housing according to [15], in the step (B), the thermoplastic resin composition is injected into the metal mold such that the thermoplastic resin member is not joined to the boundary linear portion between the bottom plate and the side plate.

[17] An electronic apparatus including the electronic device housing according to anyone of [1] to [13] and an electronic device accommodated in the electronic device housing.

Advantageous Effects of Invention

According to the present invention, it is possible to provide an electronic device housing which has an excellent balance between lightness, electromagnetic wave shielding property, heat dissipation characteristics, and mechanical strength.

BRIEF DESCRIPTION OF THE DRAWINGS

The objects described above and other objects, features, and advantages will be made clearer from the preferred embodiments to be described below and the accompanying drawings.

FIG. 9 is a schematic view for illustrating measuring places at a total of 6 linear portions formed of any 3 linear portions with a parallel relationship and any 3 linear portions orthogonal to the first 3 linear portions on a joined portion surface of the metal member (M) according to the present embodiment.

DESCRIPTION OF EMBODIMENTS

Figure 1:
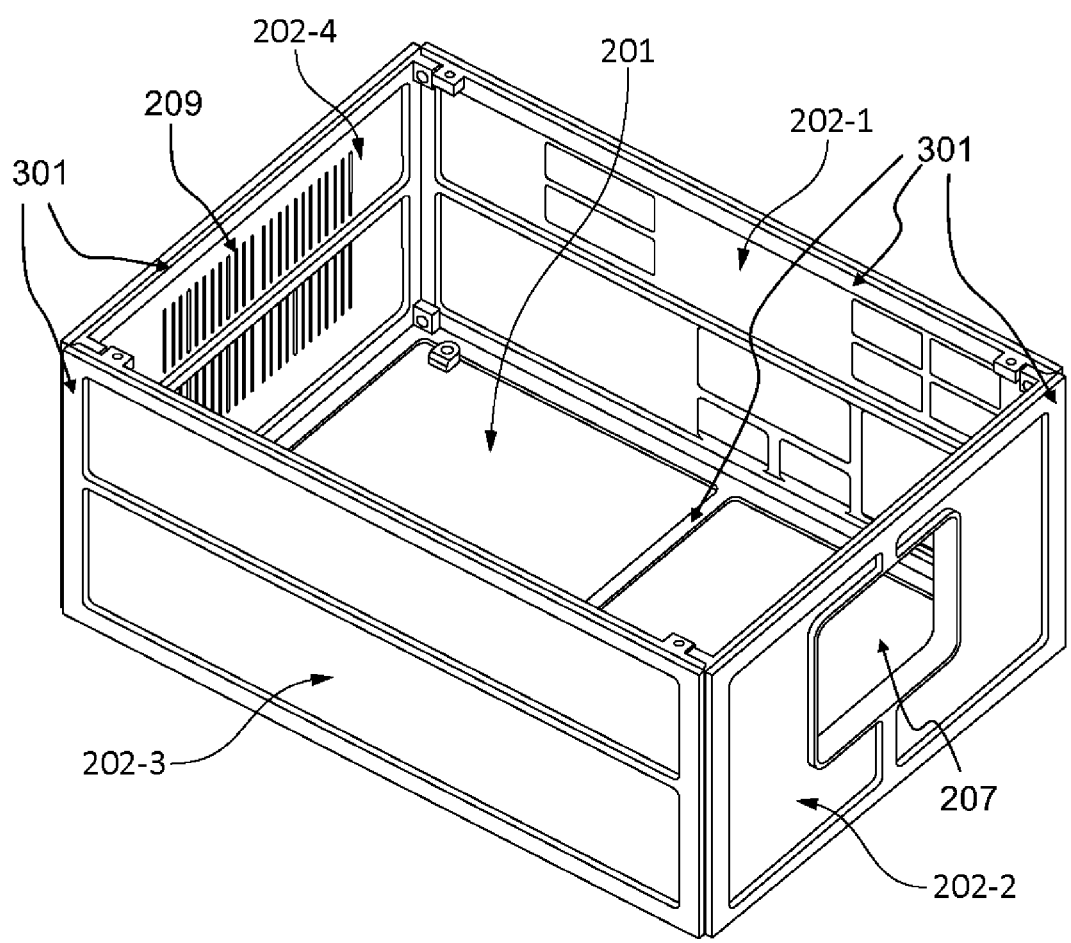
FIG. 1 is a perspective view schematically showing an example of a structure of an electronic device housing of an embodiment according to the present invention.

A description will be given of embodiments of the present invention with reference to the drawings. In all the drawings, similar constituent elements are denoted by the same reference numerals, and description thereof is omitted as appropriate. In addition, the figures are schematic views and do not match the actual dimensional ratios. "to" between numbers in a sentence means the first number or more to the second number or less unless otherwise noted.

Electronic Device Housing

First, a description will be given of an electronic device housing 100 according to the present embodiment with FIG. 1 and FIG. 2 as an example.

Figure 2:
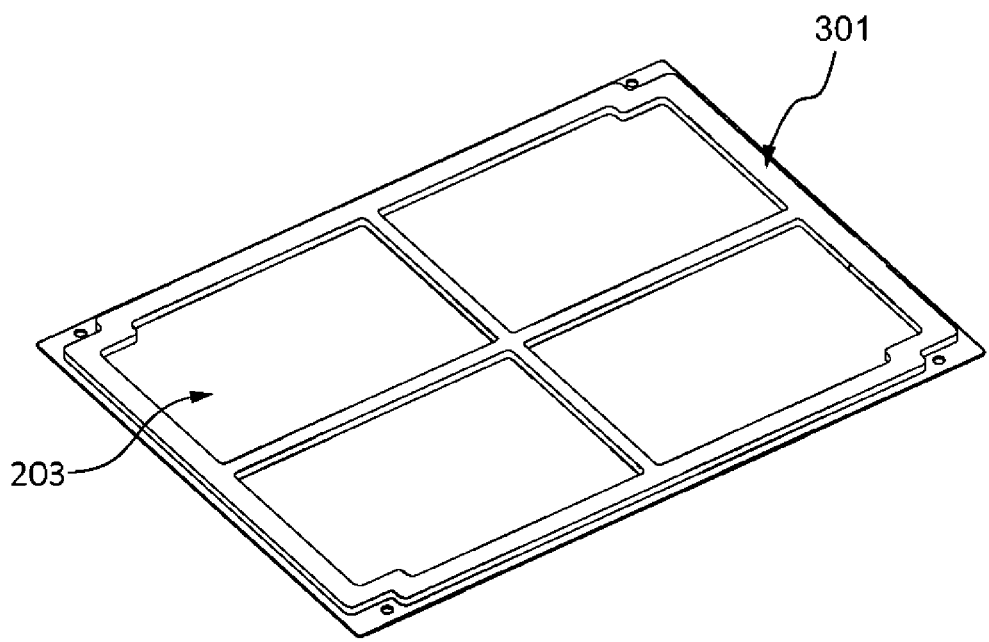
FIG. 2 is a perspective view schematically showing an example of a structure of a lid plate of an embodiment according to the present invention.

FIG. 1 is a perspective view schematically showing an example of a structure of the electronic device housing 100 of the embodiment according to the present invention. FIG. 2 is a perspective view schematically showing an example of a structure of a lid plate 203 of the embodiment according to the present invention.

The electronic device housing 100 according to the present embodiment is a housing for internally accommodating an electronic device and is provided with a metal bottom plate 201, and metal side plates 202 (202-1, 202-2, 202-3, and 202-4) folded and integrally connected to the bottom plate, in which, in a metal member (M) formed of at least the bottom plate 201 and the side plates 202, a thermoplastic resin member 301 is joined to a portion of a surface of the plate-shaped metal member (M), preferably directly joined, the metal member (M) is reinforced by the thermoplastic resin member 301, and the thermoplastic resin member 301 is joined to both surfaces of the plate-shaped metal member (M). In the present embodiment, direct joining means joining in which no intervening layer such as an adhesive-containing layer is present between the metal member (M) and the thermoplastic resin member 301.

Here, the side plates 202 are preferably engaged with each other, for example, by mechanical means. The mechanical engagement means (also called physical engagement means) is not particularly limited, but examples thereof include screw fastening or the like. The side plates 202 and the lid plate 203 provided as necessary may be engaged by the mechanical means described above or may be folded and integrally connected to any one of the side plates. In FIG. 1, there are four side plates 202-1, 202-2, 202-3, and 202-4; however, the present invention also includes embodiments in which there are 3 side plates selected from the above. However, in such a case, the lid plate is preferably folded and integrally connected to any one of the three side plates.

Since a portion of the electronic device housing 100 according to the present embodiment is switched from a heavy metal member to a lightweight resin member, it is possible to reduce the weight in comparison with housings of the related art in which the entire housing is formed of a metal member.

In addition, the electronic device housing 100 according to the present embodiment is provided with the metal bottom plate 201 and the metal side plate 202 in a portion thereof, such that it is possible to obtain the same electromagnetic wave shielding function as the housing of the related art in which the entire housing is formed of the metal member.

Furthermore, in the electronic device housing 100 according to the present embodiment, the metal member (M) formed of at least the bottom plate 201 and the side plates 202 is reinforced by the thermoplastic resin member 301, such that it is possible to suppress a decrease in the mechanical strength of the electronic device housing 100 due to the reduction of the thickness of the metal member (M). That is, it is possible to maintain the mechanical strength while reducing the weight of the electronic device housing 100.

Furthermore, in the electronic device housing 100 according to the present embodiment, since the metal bottom plate 201 and the metal side plates 202 are integrally connected, components for connecting the bottom plate and the side plates are unnecessary and it is possible to reduce the number of the components, and as a result, it is possible to simplify the step management. In addition, it is also possible to reduce the number of ground installation points. Thus, since it is possible to reduce the number of components and the number of ground installation points in the electronic device housing 100 according to the present embodiment, it is possible to realize the lighter weight electronic device housing 100.

Furthermore, since the thermoplastic resin member 301 is formed only on one portion of the surface of the plate-shaped metal member (M), it is possible to suppress the entire surface of the metal member (M) from being covered with the thermoplastic resin member 301 and to favorably maintain the heat dissipation characteristics of the electronic device housing 100.

In the electronic device housing 100 according to the present embodiment, the thermoplastic resin member 301 is joined to both surfaces of the plate-shaped metal member (M). By doing so, since it is possible to reinforce the metal member (M) from both surfaces of the metal member (M), it is possible to improve the mechanical strength of the electronic device housing 100. Due to this, it is possible to reduce the thickness of the metal member (M), and to obtain the lightweight electronic device housing 100.

As described above, the electronic device housing 100 according to the present embodiment has an excellent balance between lightness, electromagnetic wave shielding property, heat dissipation characteristics, and mechanical strength.

The metal member (M) according to the present embodiment preferably has a fine concavo-convex structure on the surface of the joined portion with the thermoplastic resin member 301. In such a case, since the metal member (M) and the thermoplastic resin member 301 are joined due to a portion of the thermoplastic resin member 301 penetrating into the fine concavo-convex structure, it is possible to further improve the joining strength between the metal member (M) and the thermoplastic resin member 301. Due to this, since it is possible to further improve the mechanical strength of the electronic device housing 100, it is possible to further reduce the thickness of the metal member (M) forming the electronic device housing 100. As a result, it is possible to obtain the lighter weight electronic device housing 100.

In addition, the thermoplastic resin member 301 joined to one surface of the plate-shaped metal member (M) and at least a portion of the thermoplastic resin member 301 joined to the other surface are preferably arranged to face each other in the vertical direction of the plate surface of the metal member (M). By doing so, it is possible to prevent the metal member (M) from being deformed due to shrinkage during molding of the thermoplastic resin member 301.

In the electronic device housing 100 according to the present embodiment, the surface area of the joined portion of the thermoplastic resin member 301 in the entire surface area of the metal member (M) (may be abbreviated as the joined portion area ratio) is, for example, 1 area % or more and 50 area % or less, preferably 2 area % or more and 40 area % or less, and more preferably 5 area % or more and 30 area % or less. When the joined portion area ratio is the above lower limit value or more, it is possible to improve the mechanical strength of the electronic device housing 100. The joined portion area ratio being the above upper limit value or less makes it possible to obtain the lightweight electronic device housing 100 which has superior heat dissipation characteristics.

In the electronic device housing 100 according to the present embodiment, as shown in FIG. 1 to FIG. 4, the thermoplastic resin member 301 is preferably joined to at least the peripheral edge portion of the surface of the metal member (M). By doing so, it is possible to reinforce the metal member (M) more effectively with a smaller amount of the thermoplastic resin member 301. Furthermore, since it is possible to reduce the usage amount of thermoplastic resin member 301, it is possible to prevent the metal member (M) from being deformed due to shrinkage during molding of thermoplastic resin member 301.

In addition, in the electronic device housing 100 according to the present embodiment, at least a portion of the thermoplastic resin member 301 is preferably formed in a frame shape on the surface of the metal member (M), for example, as shown in FIG. 1 to FIG. 4. Examples of the frame shape include at least one kind of shape selected from a bracing shape, a lattice shape, a truss shape, and a Rahmen shape. Forming the thermoplastic resin member 301 in a frame shape on the surface of the metal member (M) is preferable since it is possible to more effectively reinforce the metal member (M) with a smaller amount of the thermoplastic resin member 301.

Furthermore, since forming the thermoplastic resin member 301 in a frame shape on the surface of the metal member (M) makes it possible to reduce the usage amount of the thermoplastic resin member 301, it is possible to prevent the metal member (M) from being deformed due to shrinkage of the thermoplastic resin member 301 during molding or deterioration of the heat dissipation characteristics of the electronic device housing 100 due to the thermoplastic resin member 301.

The thickness of the thermoplastic resin member 301 according to the present embodiment may be the same thickness at all places, or the thickness may vary depending on the place.

In the electronic device housing 100 according to the present embodiment, the average thickness of the thermoplastic resin member 301 joined to the surface of the metal member (M) depends on the average thickness of the metal member (M) or the size of the entire housing and is, for example, 1.0 mm to 10 mm, preferably 1.5 mm to 8 mm, and more preferably 1.5 mm to 5.0 mm.

When the average thickness of the thermoplastic resin member 301 is the above lower limit value or more, it is possible to improve the mechanical strength of the electronic device housing 100 to be obtained.

When the average thickness of the thermoplastic resin member 301 is the above upper limit value or less, it is possible to further reduce the weight of the electronic device housing 100 to be obtained. In addition, since it is possible to reduce the usage amount of thermoplastic resin member 301, it is possible to prevent the metal member (M) from being deformed due to shrinkage during molding of the thermoplastic resin member 301.

In the electronic device housing 100 according to the present embodiment, the thermoplastic resin member 301 is preferably not joined to a boundary linear portion 205 between the bottom plate 201 and the side plate 202. By doing so, it is easier to fold the boundary linear portion 205 between the bottom plate 201 and the side plates 202, and it is possible to more easily obtain the electronic device housing 100.

In the metal member (M) according to the present embodiment, the thermoplastic resin member 301 is preferably joined to the surface of the metal bottom plate 201 and the surfaces of each of the metal side plates 202 (202-1, 202-2, 202-3, and 202-4). By doing so, it is possible to further improve the mechanical strength of the electronic device housing 100, and to further reduce the thickness of the metal member (M). As a result, it is possible to obtain the lighter weight electronic device housing 100.

Figure 3:
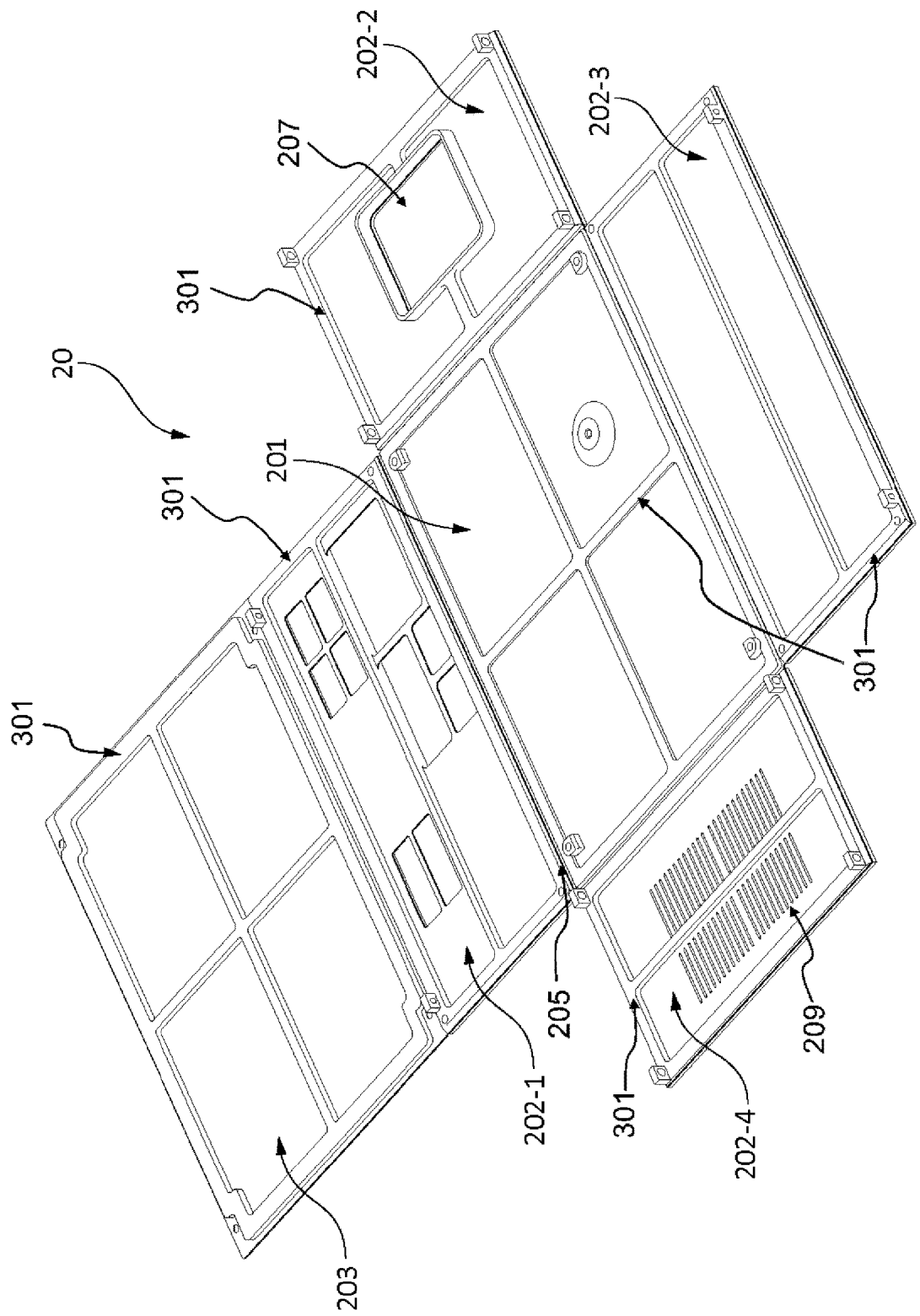
FIG. 3 is a perspective view schematically showing an example of a structure of a development plan-shaped metal plate (development plan-shaped metal resin joint plate) to which a thermoplastic resin member of an embodiment according to the present invention is joined.
Figure 4:
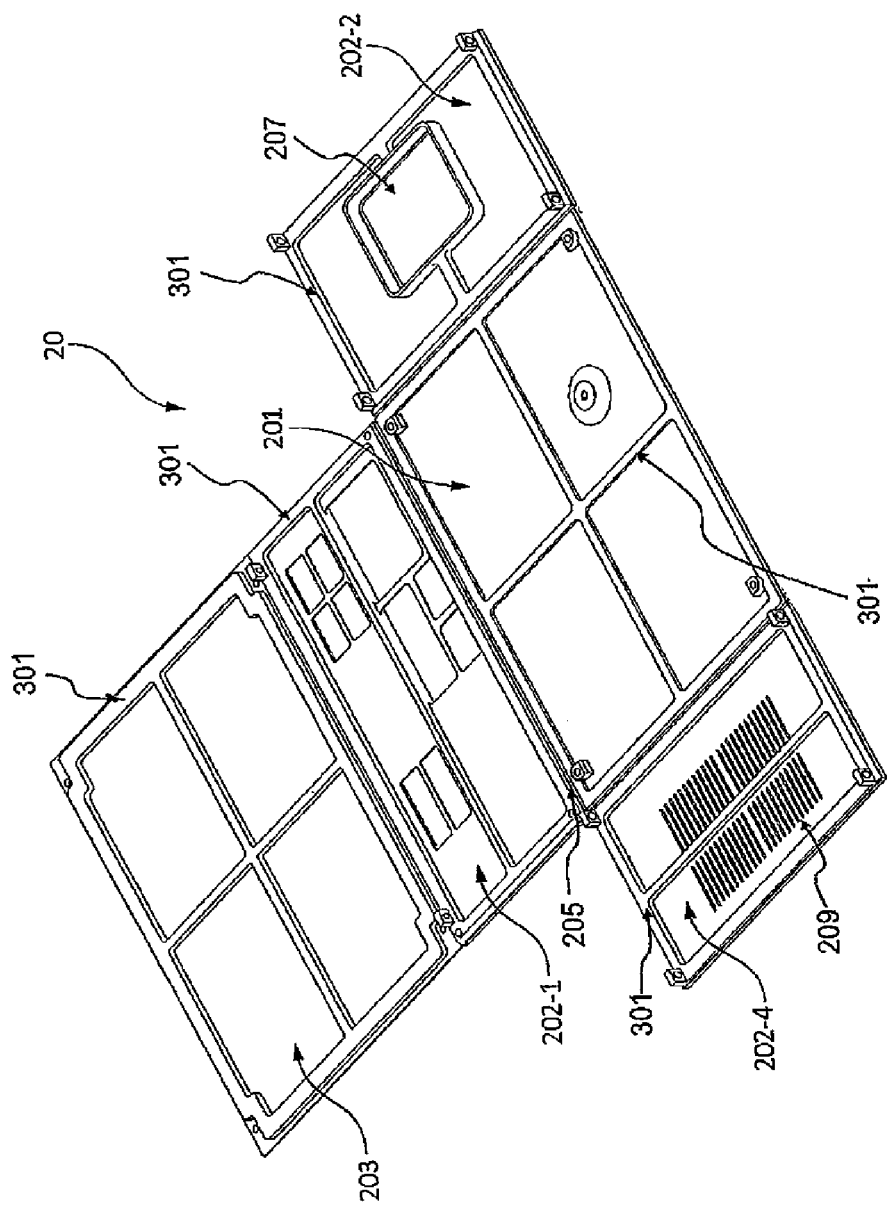
FIG. 4 is a perspective view schematically showing an example of a structure of a development plan-shaped metal plate (development plan-shaped metal resin joint plate) to which a thermoplastic resin member of an embodiment according to the present invention is joined.

In addition, the electronic device housing 100 according to the present embodiment is preferably further provided with the metal lid plate 203 folded and integrally connected to the side plates 202. In such a case, as shown in FIG. 2 to FIG. 4, the thermoplastic resin member 301 is preferably joined to a portion of the surface of the lid plate 203, and the lid plate 203 is preferably reinforced by the thermoplastic resin member 301. By doing so, it is possible to further improve the mechanical strength of the electronic device housing 100, and to further reduce the thickness of the metal member (M) forming the electronic device housing 100. As a result, it is possible to obtain the lighter weight electronic device housing 100. In addition, in such a case, in order to facilitate folding, the thermoplastic resin member 301 is preferably not joined to the boundary linear portion between the side plate 202 and the lid plate 203. The metal lid plate 203 may be prepared separately from the metal member (M) and engaged with the side plate 202 by mechanical means.

The lid plate 203 according to the present embodiment preferably has a fine concavo-convex structure similar to the surface of the joined portion of the metal member (M) on the surface of the joined portion with the thermoplastic resin member 301. In such a case, since the lid plate 203 and the thermoplastic resin member 301 are joined by a portion of the thermoplastic resin member 301 penetrating into the fine concavo-convex structure, it is possible to further improve the joining strength between the lid plate 203 and the thermoplastic resin member 301. Due to this, it is possible to improve the mechanical strength of the electronic device housing 100, thus, it is possible to reduce the thickness of the lid plate 203 forming the electronic device housing 100. As a result, it is possible to obtain the lighter weight electronic device housing 100.

Here, the above-described fine concavo-convex structure on the surface of the metal member (M) including the lid plate 203 is a fine concavo-convex structure in which convex portions having a spacing period of 5 nm or more and 500 μm or less stand close together, for example.

The thermoplastic resin member 301 is joined to the metal member (M) or the lid plate 203 due to a portion of the thermoplastic resin member 301 penetrating into the fine concavo-convex structure. By doing so, a physical resistance (anchor effect) is effectively produced between the metal member (M) or the lid plate 203 and the thermoplastic resin member 301 and it is possible to more firmly join the metal member (M) or the lid plate 203 and the thermoplastic resin member 301.

In addition, as shown in FIG. 1, the electronic device housing 100 according to the present embodiment may have an opening portion 207 or a slit 209 in the side plate 202. Having the opening portion 207 in the side plate 202 makes it possible to blow air from the opening portion 207 into the electronic device housing 100 using a blower or the like, and as a result, it is possible to cool the electronic device by blowing air in a case where the electronic device in the electronic device housing 100 is hot.

In addition, having the slit 209 in the side plate 202 makes it possible to discharge the blown air from the opening portion 207 to the outside of the electronic device housing 100.

The electronic apparatus according to the present embodiment is provided with the electronic device housing 100 and an electronic device accommodated in the electronic device housing 100. Examples of the electronic apparatus in which the electronic device is accommodated in the electronic device housing 100 according to the present embodiment include in-vehicle apparatuses represented by an audio device, a vehicle-mounted mobile telephone device, a car navigation device, an in-vehicle camera, a drive recorder, and the like.

A description will be given below of each member forming the electronic device housing 100 according to the present embodiment with reference to FIG. 1 and FIG. 2 as an example.

<Metal Member (M)>

The metal member (M) according to the present embodiment is formed of the bottom plate 201 and at least one side plate 202 selected from a side plate 202-1, a side plate 202-2, a side plate 202-3, and a side plate 202-4. One preferable aspect is formed of the bottom plate 201, the side plate 202-1, the side plate 202-2, the side plate 202-3, and the side plate 202-4. A second preferable aspect is formed of the bottom plate 201, the side plate (front surface plate) 202-1, the side plates (both side plates) 202-2 and 202-4, and the lid plate 203. A third preferable aspect is formed of the bottom plate 201, the side plate 202-1, the side plate 202-2, the side plate 202-3, the side plate 202-4, and the lid plate 203. Among these aspects, the second and third aspects are particularly preferable.

By doing so, it is possible to further reduce the number of components of the electronic device housing 100, and as a result, it is possible to more easily perform the step management and to further reduce the number of ground installation points. Further, since it is possible to further reduce the number of components and the ground installation points, it is possible to realize the even lighter weight electronic device housing 100.

The metal material forming the metal member (M) according to the present embodiment is not particularly limited, but is preferably a metal having electromagnetic wave shielding properties and examples thereof include iron, steel material, stainless steel, aluminum, aluminum alloy, magnesium, magnesium alloy, copper, copper alloys, titanium, titanium alloys, and the like. These may be used singly or in a combination of two or more kinds.

Among these, aluminum (simple aluminum) and aluminum alloys are preferable in view of lightness, low cost, and high strength, and aluminum alloys are more preferable.

The aluminum alloy is not particularly limited, but is an alloy with aluminum as a main component. Specifically, examples thereof include an alloy of aluminum and at least one type of metal selected from copper, manganese, silicon, magnesium, zinc, nickel, and the like.

As the aluminum alloy according to the present embodiment, it is preferable to use aluminum alloys having the four-digit numbers of the international aluminum alloy names specified in Japanese Industrial Standard (JIS H 4140), which are the aluminum-copper-based alloys of the 2000 series, aluminum-manganese-based alloys of the 3000 series, aluminum-silicon-based alloys of the 4000 series, aluminum-magnesium-based alloys of the 5000 series, aluminum-magnesium-silicon-based alloys of the 6000 series, aluminum-zinc-magnesium-based alloys and aluminum-zinc-magnesium-copper-based alloys of the 7000 series, and the like. Among these, it is particularly preferable to use the aluminum-magnesium alloys of the 5000 series from the viewpoint of availability and mechanical and thermal characteristics.

The thickness of the metal member (M) according to the present embodiment may be the same thickness at all places, or the thickness may be different depending on the places. The average thickness of the metal member (M) is preferably 0.2 mm or more and 1.0 mm or less, more preferably more than 0.2 mm and 1.0 mm or less, and particularly preferably more than 0.2 mm and 0.8 mm or less.

When the average thickness of the metal member (M) is the lower limit value or more, it is possible to improve the mechanical strength, the heat dissipation characteristics, and the electromagnetic wave shielding characteristics of the electronic device housing 100 to be obtained.

Making the average thickness of the metal member (M) the upper limit value or less makes it possible to further reduce the weight of the electronic device housing 100 to be obtained. Furthermore, since the average thickness of the metal member (M) is the above upper limit value or less, the metal member (M) is easier to fold and it is possible to further improve the productivity of the electronic device housing 100.

It is possible for the shape of the metal member (M) to be, for example, a plate shape. The metal member (M) is preferably formed by processing a metal material into a predetermined shape by a known method such as plastic processing by cutting, pressing, or the like, removal processing such as punching processing, cutting out, polishing, or electric discharge machining, and then applying a roughening treatment to be described below. In short, it is preferable to use a metal material processed into a required shape by various processing methods.

A fine concavo-convex structure in which convex portions having a spacing period of 5 nm or more and 500 μm or less stand close together is formed on the surface of the joined portion of the metal member (M) with the thermoplastic resin member 301, for example.

Here, the spacing period of the fine concavo-convex structure is the average value of the distance from the convex portions to the adjacent convex portions, and is able to be obtained using a photograph taken with an electron microscope or a laser microscope or using a surface roughness measuring device.

The spacing period measured by an electron microscope or a laser microscope is usually a spacing period of less than 500 nm, specifically, the joined portion surface of the metal member (M) is photographed. From the photograph, 50 arbitrary convex portions are selected, and the distances from these convex portions to adjacent convex portions are measured, respectively. All the distances from the convex portions to the adjacent convex portions are integrated and divided by 50 to find the spacing period. On the other hand, the spacing period exceeding 500 nm is usually obtained using a surface roughness measuring device.

Since the surface roughening treatment is applied to not only the surface of the joined portion of the metal member (M) but also to the entire surface of the metal member (M), it is also possible to measure the spacing period from places other than the joined portion surface on the same surface as the surface of the joined portion of the metal member (M).

The spacing period is preferably 10 nm or more and 300 μm or less, and more preferably 20 nm or more and 200 μm or less.

When the spacing period is the lower limit value or more, the thermoplastic resin composition (P) forming the thermoplastic resin member 301 is able to sufficiently enter the concave portion of the fine concavo-convex structure, and it is possible to further improve the joining strength between the metal member (M) and the thermoplastic resin member 301. In addition, when the spacing period is the upper limit value or less, it is possible to suppress the occurrence of a gap in the joined portion between the metal member (M) and the thermoplastic resin member 301. As a result, since it is possible to suppress the entry of impurities such as moisture from the gaps at the metal-resin interface, it is possible to suppress decreases in strength when the electronic device housing 100 is used in high temperature and high humidity conditions.

Methods of forming the fine concavo-convex structure having the spacing period described above include a method of immersing the metal member in an inorganic base aqueous solution containing NaOH or the like and/or an inorganic acid aqueous solution containing HCl, HNO$_3$, or the like; a method of treating the metal member using an anodic oxidation method; a method of forming concavities and convexities on the surface of a metal member by pressing a metal mold punch having concavities and convexities produced by mechanical cutting, for example, diamond abrasive grinding or blasting; a method of preparing a concavo-convex shape on the surface of a metal member by sandblasting, knurling, or laser processing; a method in which a metal member is immersed in one or more aqueous solutions selected from hydrated hydrazine, ammonia, and a water-soluble amine compound as disclosed in International Publication No. 2009/31632; or the like. It is possible to selectively use these methods depending on the type of the metal material forming the metal member (M) or the concavo-convex shape formed within the range of the spacing period. In the present embodiment, the method of immersing a metal member in an inorganic base aqueous solution containing NaOH or the like and/or an inorganic acid aqueous solution containing HCl, HNO$_3$, or the like is able to treat a wide range of metal members collectively, and is excellent in the joining strength between the metal member (M) and the thermoplastic resin member 301, which is preferable.

From the viewpoint of further improving the joining strength between the metal member (M) and the thermoplastic resin member 301, for a total of 6 linear portions formed of any 3 linear portions with a parallel relationship and any 3 linear portions orthogonal to the first 3 linear portions on a joined portion surface 104 of the metal member (M), it is preferable for the surface roughness measured in accordance with JIS B 0601 (corresponding to international standard: ISO 4287) to satisfy the following requirements (1) and (2) at the same time.

(1) One or more linear portions having a load length ratio (Rmr) with a roughness curve of 30% or less at a cutting level of 20% and an evaluation length of 4 mm are included (2) The ten-point average roughness (Rz) of all linear portions at an evaluation length of 4 mm exceeds 2 μm FIG. 9 is a schematic view for illustrating a total of 6 linear portions formed of any 3 linear portions with a parallel relationship and any 3 linear portions orthogonal to the first 3 linear portions on the joined portion surface 104 of the metal member (M).

For example, it is possible to select six linear portions B1 to B6 as shown in FIG. 9 as the six linear portions. First, as the reference line, a center line B1 passing through a center portion A of the joined portion surface 104 of the metal member (M) is selected. Next, straight lines B2 and B3 with a parallel relationship to the center line B1 are selected. Next, a center line B4 orthogonal to the center line B1 is selected, and straight lines B5 and B6 orthogonal to the centerline B1 and with a parallel relationship with the center line B4 are selected. Here, vertical distances D1 to D4 between each straight line are, for example, 2 to 5 mm.

In general, since the metal member (M) is subjected to a surface roughening treatment over the entire metal member (M) and not only on the joined portion surface 104 of the metal member (M) with the thermoplastic resin member 301, for example, six linear portions may be selected from places other than the joined portion surface 104 on the same side as or the opposite side to the joined portion surface 104 of the metal member (M) with the thermoplastic resin member 301.

The reason why it is possible to obtain the electronic device housing 100 which is superior due to the joining strength between the metal member (M) and the thermoplastic resin member 301 when the above requirements (1) and (2) are satisfied at the same time is not clearly understood; however, it is considered to be because the joined portion surface 104 of the metal member (M) with the thermoplastic resin member 301 is structured to be able to effectively express the anchor effect between the metal member (M) and the thermoplastic resin member 301.

From the viewpoint of further improving the joining strength between the metal member (M) and the thermoplastic resin member 301, for a total of 6 linear portions formed of any 3 linear portions with a parallel relationship and any 3 linear portions orthogonal to the first 3 linear portions on the joined portion surface 104 of the metal member (M), it is preferable for the surface roughness measured in accordance with JIS B 0601 (corresponding to international standard: ISO 4287) to further satisfy one or more of the following requirements (1A) to (1C), and it is particularly preferable to satisfy requirement (1C).

(1A) Two or more linear portions having a load length ratio (Rmr) with a roughness curve of 30% or less at a cutting level of 20% and an evaluation length of 4 mm are preferably included, more preferably three or more such linear portions, and most preferably six such linear portions (1B) One or more linear portions having a load length ratio (Rmr) with a roughness curve of 20% or less at a cutting level of 20% and an evaluation length of 4 mm are preferably included, more preferably two or more such linear portions, even more preferably three or more such linear portions, and most preferably six such linear portions (1C) One or more linear portions having a load length ratio (Rmr) with a roughness curve of 60% or less at a cutting level of 40% and an evaluation length of 4 mm are preferably included, more preferably two or more such linear portions, even more preferably three or more such linear portions, and most preferably six such linear portions In addition, from the viewpoint of further improving the joining strength between the metal member (M) and the thermoplastic resin member 301, the average value of the load length ratio (Rmr) with a roughness curve at a cutting level of 20% and an evaluation length of 4 mm measured in accordance with JIS B 0601 (corresponding to international standard: ISO 4287) on the joined portion surface 104 of the metal member (M), is preferably 0.1% or more and 40% or less, more preferably 0.5% or more and 30% or less, even more preferably 1% or more and 20% or less, and most preferably 2% or more and 15% or less.

As the average value of the load length ratio (Rmr), it is possible to adopt the average of the load length ratios (Rmr) of the six arbitrary linear portions described above.

It is possible to control the load length ratio (Rmr) of the joined portion surface 104 of the metal member (M) according to the present embodiment by appropriately adjusting the conditions of the roughening treatment on the surface of the metal member.

In the present embodiment, in particular, examples of factors for controlling the load length ratio (Rmr) include the kind and concentration of the etching agent, the temperature and time of the roughening treatment, the timing of the etching treatment, and the like.

From the viewpoint of further improving the joining strength between the metal member (M) and the thermoplastic resin member 301, for a total of 6 linear portions formed of any 3 linear portions with a parallel relationship and any 3 linear portions orthogonal to the first 3 linear portions on the joined portion surface 104 of the metal member (M), it is preferable for the surface roughness measured in accordance with JIS B 0601 (corresponding to international standard: ISO 4287) to further satisfy the following requirement (2A).

(2A) The ten-point average roughness (Rz) of all linear portions at an evaluation length of 4 mm is preferably more than 5 µm, more preferably 10 µm or more, and even more preferably 15 µm or more.

From the viewpoint of further improving the joining strength between the metal member (M) and the thermoplastic resin member 301, the average value of the ten-point average roughness (Rz) on the joined portion surface 104 of the metal member (M) is preferably more than 2 µm and 50 µm or less, more preferably more than 5 µm and 45 µm or less, even more preferably 10 µm or more and 40 µm or less, and particularly preferably 15 µm or more and 30 µm or less.

It is possible to adopt the average of the ten-point average roughness (Rz) of any of the six linear portions described above as the average value of the ten-point average roughness (Rz).

From the viewpoint of further improving the joining strength between the metal member (M) and the thermoplastic resin member 301, for a total of 6 linear portions formed of any 3 linear portions with a parallel relationship and any 3 linear portions orthogonal to the first 3 linear portions on the joined portion surface 104 of the metal member (M), it is preferable for the surface roughness measured in accordance with JIS B 0601 (corresponding to international standard: ISO 4287) to further satisfy the following requirement (4).

(4) The average length (RSm) of the roughness curve elements of all linear portions is more than 10 µm and less than 300 µm, and more preferably 20 µm or more and 200 µm or less.

From the viewpoint of further improving the joining strength between the metal member (M) and the thermoplastic resin member 301, the average value of the average length (RSm) of the roughness curve elements on the joined portion surface 104 on the metal member (M) is preferably more than 10 µm and less than 300 µm, and more preferably 20 µm or more and 200 µm or less.

It is possible to adopt the average of the ten-point average roughness (Rz) of any of the six linear portions described above as the average value of the average length (RSm) of the roughness curve elements.

Here, in the present embodiment, in a case where the average thickness of the metal member (M) is in the range of 500 µm or more, the average value of the average length (RSm) of the roughness curve elements is the spacing period.

It is possible to control the ten-point average roughness (Rz) and the average length (RSm) of the roughness curve element of the joined portion surface 104 of the metal member (M) according to the present embodiment by appropriately adjusting the conditions of the roughening treatment on the surface of the metal member.

In the present embodiment, in particular, examples of factors for controlling the ten-point average roughness (Rz) and the average length (RSm) of the roughness curve elements include the temperature and time of the roughening treatment, the etching amount, and the like.

Next, a description will be given of a method for preparing the metal member (M) satisfying the spacing period, the load length ratio (Rmr), the ten-point average roughness (Rz), the average length (RSm) of the roughness curve element, and the like described above.

It is possible to form such a metal member (M) by, for example, applying a roughening treatment to the surface of a metal member using an etching agent.

An example of the metal member roughening treatment method for obtaining the metal member (M) satisfying the spacing period, the load length ratio (Rmr), the ten-point average roughness (Rz), the average length (RSm) of the roughness curve element, and the like described above will be shown below. However, the metal member roughening treatment method according to the present embodiment is not limited to the following example.

(1) Pretreatment Step

First, it is desirable that the metal member does not have a thick film formed of an oxide film, a hydroxide, or the like on the surface on the side joined to the thermoplastic resin member 301. In order to remove such a thick film, the surface layer may be polished by mechanical polishing such as sand blasting, shot blasting, grinding, or barrel processing, or by chemical polishing before the next step of treatment with the etching agent. In addition, in a case where the surface of the side joined with the thermoplastic resin member 301 is remarkably contaminated due to machine oil or the like, it is preferable to perform a treatment with an alkaline aqueous solution such as a sodium hydroxide aqueous solution or a potassium hydroxide aqueous solution, or to perform degreasing.

(2) Surface Roughening Treatment Step

In the present embodiment, as the surface roughening treatment method of the metal member, it is preferable to perform treatment using an acid-based etching agent to be described below at a specific timing. Specifically, it is preferable to perform the treatment with the acid-based etching agent at the final stage of the surface roughening treatment step.

Examples of the method of performing the roughening treatment using the acid-based etching agent include a treatment method using immersion, spraying, or the like. The treatment temperature is preferably 20 to 40° C. and the treatment time is preferably approximately 5 to 350 seconds, and, from the viewpoint of more uniformly roughening the surface of the metal member, more preferably 20 to 300 seconds, and particularly preferably 50 to 300 seconds.

The surface of the metal member is roughened into a concavo-convex shape by the roughening treatment using the acid-based etching agent. The amount of etching (amount of dissolution) in the depth direction of the metal member when using the acid-based etching agent is preferably 0.1 to 500 µm in a case of being calculated from the mass, specific gravity, and surface area of the dissolved metal member, more preferably 5 to 500 µm, and even more preferably 5 to 100 µm. When the etching amount is the lower limit value or more, it is possible to further improve the joining strength between the metal member (M) and the thermoplastic resin member 301. In addition, when the etching amount is the above upper limit value or less, it is possible to reduce the treatment cost. It is possible to adjust the etching amount according to the treatment temperature, treatment time, and the like.

In the present embodiment, when carrying out the roughening treatment on the metal member using the acid-based etching agent, the entire surface of the metal member surface may be roughened, or only the surface to which the thermoplastic resin member 301 is joined may be partially roughened.

(3) Post-Treatment Step

In the present embodiment, it is usually preferable to carry out water washing and drying after the surface roughening treatment step. The method of water washing is not particularly limited, but washing with immersion or running water for a predetermined time is preferable.

Furthermore, as a post-treatment step, ultrasonic cleaning is preferably performed in order to remove smut or the like produced by the treatment using the acid-based etching agent. The conditions for ultrasonic cleaning are not particularly limited as long as the conditions permit the removal of the generated smut or the like, but water is preferable as the solvent to be used, and the treatment time is preferably 1 to 20 minutes.

(Acid-Based Etching Agent)

In the present embodiment, a specific acid-based etching agent described below is preferable as the etching agent to be used for the roughening treatment of the surface of the metal member. Performing the treatment with the above specific etching agent forms a fine concavo-convex structure suitable for improving the adhesion between the metal member and the thermoplastic resin member 301 on the surface of the metal member, and it is considered that the joining strength between the metal member (M) and the thermoplastic resin member 301 is further improved due to the anchor effect.

A description will be given below of components of the acid-based etching agent able to be used in the present embodiment.

The acid-based etching agent includes at least one of ferric ions and cupric ions, and an acid, and is able to include manganese ions, various additives, and the like as necessary.

Ferric Ions

The ferric ions are a component for oxidizing the metal member, and it is possible to include the ferric ions in the acid-based etching agent by blending in a ferric ion source. Examples of ferric ion sources include ferric nitrate, ferric sulfate, ferric chloride, and the like. Among the above ferric ion sources, ferric chloride is preferable from the viewpoint of excellent solubility and low cost.

In the present embodiment, the content of the ferric ions in the acid-based etching agent is preferably 0.01 to 20 mass %, more preferably 0.1 to 12 mass %, even more preferably 0.5 to 7 mass %, yet more preferably 1 to 6 mass %, and particularly preferably 1 to 5 mass %. When the content of the ferric ions is the above lower limit value or more, it is possible to prevent a reduction in the roughening rate (dissolution rate) of the metal member. On the other hand, since it is possible to appropriately maintain the roughening rate when the content of the ferric ions is the above upper limit value or less, it is possible to perform uniform roughening more suitable for improving the joining strength between the metal member (M) and the thermoplastic resin member 301.

Cupric Ions

The cupric ions described above are a component for oxidizing the metal member, and it is possible to include the cupric ions in the acid-based etching agent by blending in a cupric ion source. Examples of cupric ion sources include cupric sulfate, cupric chloride, cupric nitrate, cupric hydroxide, and the like. Among the above cupric ion sources, cupric sulfate and cupric chloride are preferable from the viewpoint of being low cost.

In the present embodiment, the content of the cupric ions in the acid-based etching agent is preferably 0.001 to 10 mass %, more preferably 0.01 to 7 mass %, even more preferably 0.05 to 1 mass %, yet more preferably 0.1 to 0.8 mass %, still more preferably 0.15 to 0.7 mass %, and particularly preferably 0.15 to 0.4 mass %. When the content of the cupric ions is the lower limit value or more, it is possible to prevent a reduction of the roughening rate (dissolution rate) of the metal member. On the other hand, since it is possible to appropriately maintain the roughening rate when the content of the cupric ion is the upper limit value or less, it is possible to obtain more appropriate uniform roughening due to the improved joining strength between the metal member (M) and the thermoplastic resin member 301.

The acid-based etching agent may include only one of ferric ions and cupric ions, or may include both, but including both ferric ions and cupric ions is preferable. The acid-based etching agent including both ferric ions and cupric ions makes it possible to easily obtain a favorable roughened shape more appropriate for improving the joining strength between the metal member (M) and the thermoplastic resin member 301.

In a case where the acid-based etching agent includes both ferric ions and cupric ions, the content of each of the ferric ions and the cupric ions is preferably within the above range. In addition, the total content of ferric ions and cupric ions in the acid-based etching agent is preferably 0.011 to 20 mass %, more preferably 0.1 to 15 mass %, even more preferably 0.5 to 10 mass %, and particularly preferably 1 to 5 mass %.

Manganese Ions

Manganese ions may be included in the acid-based etching agent in order to evenly and uniformly roughen the surface of the metal member. It is possible for the manganese ions to be included in the acid-based etching agent by blending in a manganese ion source. Examples of manganese ion sources include manganese sulfate, manganese chloride, manganese acetate, manganese fluoride, manganese nitrate, and the like. Among the above manganese ion sources, manganese sulfate and manganese chloride are preferable from the viewpoints of being low cost and the like.

In the present embodiment, the content of the manganese ions in the acid-based etching agent is preferably 0 to 1 mass %, and more preferably 0 to 0.5 mass %. In a case where a thermoplastic resin (P1) forming the thermoplastic resin member 301 is a polyolefin-based resin, even if the content of the manganese ions is 0 mass %, the present inventors confirmed that a sufficient joining strength is exhibited. That is, in a case where a polyolefin-based resin is used as the thermoplastic resin (P1), the manganese ion content is preferably 0 mass %, while in a case where a thermoplastic resin other than a polyolefin-based resin is used as the thermoplastic resin (P1), manganese ions are appropriately used with the upper limit value described above or less.

Acid

The acid is a component which dissolves the metal oxidized by ferric ions or cupric ions or both. Examples of acids include inorganic acids such as hydrochloric acid, hydrobromic acid, sulfuric acid, nitric acid, phosphoric acid, perchloric acid, and sulfamic acid, and organic acids such as sulfonic acid and carboxylic acid. Examples of carboxylic acids include formic acid, acetic acid, citric acid, oxalic acid, malic acid, and the like. It is possible to blend one or two or more kinds of these acids in the acid-based etching agent. Among the inorganic acids, sulfuric acid is preferable since sulfuric acid has almost no odor and is low cost. In addition, among the organic acids, carboxylic acid is preferable from the viewpoint of uniformity of the roughened shape.

In the present embodiment, the content of the acid in the acid-based etching agent is preferably 0.1 to 50 mass %, more preferably 0.5 to 50 mass %, even more preferably 1 to 50 mass %, still more preferably 1 to 30 mass %, yet more preferably 1 to 25 mass %, and yet more preferably 2 to 18 mass %. When the content of the acid is the lower limit value or more, it is possible to prevent a reduction in the roughening rate (dissolution rate) of the metal member. On the other hand, when the content of the acid is the upper limit value or less, it is possible to prevent crystal precipitation of the metal salt of the metal member when the temperature of the solution decreases, thus, it is possible to improve workability.

Other Components

A surfactant may be added to the acid-based etching agent which is able to be used in the present embodiment to prevent concavo-convex roughening due to surface contamination such as fingerprints, and other additives may be added as necessary. Examples of other additives include halide ion sources to be added to form deep concavities and convexities, for example, sodium chloride, potassium chloride, sodium bromide, potassium bromide, and the like. Alternatively, examples may include thio compounds such as thiosulfate ions or thiourea to be added in order to increase the roughening treatment rate, azoles such as imidazole, triazole, or tetrazole added to obtain a more uniform roughened shape, pH adjusting agents or the like added for controlling the roughening reaction, and the like. In a case where these other components are added, the total content thereof is preferably approximately 0.01 to 10 mass % in the acid-based etching agent.

It is possible to easily prepare the acid-based etching agent of the present embodiment by dissolving each of the above components in ion exchanged water or the like.

<Thermoplastic Resin Member>

A description will be given below of the thermoplastic resin member 301 according to the present embodiment.

The thermoplastic resin member 301 according to the present embodiment is formed of a thermoplastic resin composition (P). The thermoplastic resin composition (P) includes a thermoplastic resin (P1) as an essential component, and includes other blending agents (P2) as necessary. For the sake of convenience, the thermoplastic resin member 301 will be described as formed of the thermoplastic resin (P) even in a case where the thermoplastic resin member 301 is formed only of the thermoplastic resin composition (P1).

(Thermoplastic Resin (P1))

The thermoplastic resin (P1) is not particularly limited, but examples thereof include polyolefin-based resins, (meth)acrylic-based resins such as poly(meth)acrylate methyl resins, polystyrene resins, polyvinyl alcohol-polyvinylchloride copolymer resins, polyvinyl acetal resins, polyvinyl butyral resins, polyvinyl formal resins, polymethyl pentene resins, maleic anhydride-styrene copolymer resins, polycarbonate resins, polyphenylene ether resins, aromatic polyether ketones such as polyether ether ketone resins, and polyether ketone resin, polyester resins, polyester-based resins, polyamide-based resins, polyamide imide resins, polyimide resins, polyether imide resins, styrene-based elastomers, polyolefin-based elastomers, polyurethane-based elastomers, polyester-based elastomers, polyamide-based elastomers, ionomers, aminopolyacrylamide resins, isobutylene maleic anhydride copolymer, ABS, ACS, AES, AS, ASA, MBS, an ethylene-vinylchloride copolymer, an ethylene-vinyl acetate copolymer, an ethylene-vinyl acetate-vinylchloride graft polymer, an ethylene-vinyl alcohol copolymer, chlorinated polyvinylchloride resins, chlorinated polyethylene resins, chlorinated polypropylene resins, carboxyvinyl polymer, ketone resins, amorphous copolyester resins, norbornene resins, fluoroplastic, polytetrafluoroethylene resins, fluorinated ethylene polypropylene resins, PFA, polychlorofluoroethylene resins, ethylene tetrafluoroethylene copolymer, polyvinylidene fluoride resins, polyvinyl fluoride resins, polyarylate resins, thermoplastic polyimide resins, polyvinylidene chloride resins, polyvinylchloride resins, polyvinyl acetate resins, polysulfone resins, polyparamethylstyrene resins, polyallylamine resins, polyvinyl ether resins, polyphenylene oxide resins, polyphenylene sulfide (PPS) resins, polymethylpentene resins, an oligoester acrylate, xylene resins, maleic acid resins, polyhydroxybutyrate resins, polysulfone resins, polylactic acid resins, polyglutamic acid resins, polycaprolactone resins, polyethersulfone resins, polyacrylonitrile resins, styrene-acrylonitrile copolymer resins, acrylonitrile-butadiene-styrene copolymer resins, polyacetal resins, and the like. These thermoplastic resins may be used singly or in a combination of two or more kinds.

Among the above, from the viewpoint that it is possible to more effectively obtain the effect of improving the joining strength between the metal member (M) and the thermoplastic resin member 301, it is possible to suitably use one kind or two or more kinds of thermoplastic resins selected from a polyolefin-based resin, a polyester resin, a polyamide resin, a polyphenylene sulfide resin, a polycarbonate resin, a polyether ether ketone resin, a polyether ketone resin, a polyimide resin, a polyether sulfone resin, a polystyrene resin, a polyacrylonitrile resin, a styrene-acrylonitrile copolymer resin, an acrylonitrile-butadiene-styrene copolymer resin, a (meth)acrylic polyester resin, and a polyacetal resin.

It is possible to use polymers obtained by polymerizing an olefin as the polyolefin-based resin without particular limitation. Examples of the olefins forming the polyolefin-based resin include ethylene, α-olefins, cyclic olefins, polar olefins, and the like.

The α-olefin includes a linear or branched α-olefin having 3 to 30 carbon atoms, and preferably 3 to 20 carbon atoms. More specifically, examples thereof include propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, and the like.

Examples of the cyclic olefins include cyclic olefins having 3 to 30 carbon atoms, and preferably 3 to 20 carbon atoms. More specifically, examples thereof include cyclopentene, cycloheptene, norbornene, 5-methyl-2-norbornene, tetracyclododecene, 2-methyl-1,4,5,8-dimethano-1,2,3,4,4a,5,8,8a-octahydronaphthal ene, and the like.

Examples of the polar olefins include vinyl acetate, methyl methacrylate, methyl acrylate, ethyl acrylate, and the like.

Preferable examples of the olefins forming the polyolefin-based resin include ethylene, propylene, 1-butene, 1-pentene, 3-methyl-1-butene, 1-hexene, 4-methyl-1-pentene, 3-methyl-1-pentene, and the like. Among the above, ethylene, propylene, 1-butene, 1-hexene, and 4-methyl-1-pentene are more preferable, and ethylene or propylene are even more preferable.

The polyolefin-based resin may be obtained by polymerizing one kind of the olefins described above alone, or random copolymers, block copolymers, or graft copolymers obtained combining two or more kinds of olefins.

The polyolefin-based resin may be a blend formed of polyolefins having different properties. Examples thereof include blends of one or more kinds selected from a propylene homopolymer, a propylene random copolymer, and a propylene block copolymer and elastomers such as propylene-ethylene copolymer rubber, or an ethylene-α-olefin copolymer (in which the α-olefin is 1-butene, 1-hexene, 1-octene, or the like).

The polyolefin-based resin may be either linear or may incorporate a branched structure.

Examples of polyester resins include aliphatic polyesters such as polylactic acid, polyglycolic acid, polycaprolactone, and polyethylene succinate, polyethylene terephthalate, polyethylene naphthalate, polybutylene terephthalate (PBT), polycyclohexylenedimethylene terephthalate (PCT), and the like.

Examples of the polyamide resin include ring-opening polymerization type aliphatic polyamides such as PA6 and PA12; polycondensation type polyamides such as PA66, PA46, PA610, PA612, and PA11; semi-aromatic polyamides such as MXD6, PA6T, PA9T, PA6T/66, PA6T/6, and amorphous PA; wholly aromatic polyamides such as poly(p-phenylene terephthalamide), poly(m-phenylene terephthalamide), and poly(m-phenylene isophthalamide), amide elastomers, and the like.

(Other Blending Agents (P2))

The thermoplastic resin composition (P) may contain other blending agents (P2) for the purpose of imparting individual functions. Examples of the blending agents (P2) include a filler, a flame retardant, a flame-retardant aid, a thermal stabilizer, an antioxidant, a pigment, a weathering agent, a plasticizer, a dispersant, a lubricant, a release agent, an antistatic agent, an impact resistance modifier, and the like.

In the present embodiment, from the viewpoint of adjusting the difference in linear expansion coefficient between the metal member (M) and the thermoplastic resin member 301 and improving the mechanical strength of the thermoplastic resin member 301, the thermoplastic resin member 301 preferably further includes a filler.

As the filler, for example, it is possible to select one kind or two or more kinds from a group consisting of hydrotalcites, glass fibers, carbon fibers, metal fibers, organic fibers, carbon particles, clay, talc, silica, minerals, and cellulose fibers. Among the above, one kind or two or more kinds selected from hydrotalcites, glass fibers, carbon fibers, talc, and minerals is preferable.

The shape of the filler is not particularly limited and may be any shape such as fibrous, particulate, or plate-like.

In a case where the thermoplastic resin member 301 includes a filler, when the entire thermoplastic resin member 301 is 100 mass %, the content thereof is, for example, 5 mass % or more and 95 mass % or less, preferably 10 mass % or more and 90 mass % or less, more preferably 20 mass % or more and 90 mass % or less, even more preferably 30 mass % or more and 90 mass % or less, and particularly preferably 50 mass % or more and 90 mass % or less.

Besides the effect of increasing the rigidity of the thermoplastic resin member 301, the filler has an effect of being able to control the linear expansion coefficient of the thermoplastic resin member 301. In particular, in the case of the electronic device housing 100 of the present embodiment, since the temperature dependence of the shape stability of the metal member (M) and the thermoplastic resin member 301 is often greatly different, distortion tends to be applied to the electronic device housing 100 when large temperature changes occur. The thermoplastic resin member 301 containing a filler makes it possible to reduce this distortion. In addition, the content of the filler being within the above range makes it possible to suppress a reduction in toughness.

In the present embodiment, the filler is preferably a fibrous filler, more preferably glass fibers and carbon fibers, and particularly preferably glass fibers.

Due to this, since it is possible to suppress shrinkage of the thermoplastic resin member 301 after molding, it is possible to strengthen the joining between the metal member (M) and the thermoplastic resin member 301.

Examples of the hydrotalcites include natural products and synthetic products and examples thereof include hydrotalcites not including hydrous basic carbonate such as magnesium, calcium, zinc, aluminum, bismuth or the crystal water thereof. Examples of natural products include products having a structure of $Mg_6Al_2(OH)_{16}CO_3.4H_2O$. Examples of synthetic products include $Mg_{0.7}Al_{0.3}(OH)_2(CO_3)_{0.15}.0.54H_2O$, $Mg_{4.5}Al_2(OH)_{13}CO_3.3.5H_2O$ $Mg_{4.2}Al_2(OH)_{12.4}(CO_3)_{0.15}$, $Zn_6Al_2(OH)_{16}CO_3.4H_2O$, $Ca_6Al_2(OH)_{16}CO_3.4H_2O$, $Mg_{14}Bi_2(OH)_{29.6}.4.2H_2O$, and the like. The blending amount of the hydrotalcite is preferably, for example, 0.01 parts by mass or more and 2 parts by mass or less per 100 parts by mass of the thermoplastic resin composition (P). When the blending amount of the hydrotalcite is the above lower limit value or more, it is possible to improve the heat resistance of the thermoplastic resin member 301 to be obtained. When the blending amount of the hydrotalcite is the above upper limit value or less, it is possible to improve the flame retardancy of the thermoplastic resin member 301 to be obtained.

Examples of the flame retardant include bis(2,3-dibromopropyl) ether of tetrabromobisphenol A, bis(2,3-dibromopropyl) ether of tetrabromobisphenol S, bis(2,3-dibromopropyl) ether of tetrabromobisphenol A, tris(2,3-dibromopropyl) isocyanurate, and mixtures of two or more type of the above. The content of the flame retardant is, for example, 5 to 25 parts by mass, and preferably 10 to 20 parts by mass, per 100 parts by mass of the thermoplastic resin composition (P). When the content of the flame retardant is the above lower limit value or more, it is possible to improve the flame retardancy of the thermoplastic resin member 301 to be obtained. When the content of the flame retardant is the above upper limit value or less, it is possible to improve the mechanical properties of the thermoplastic resin member 301 to be obtained.

It is possible for the thermoplastic resin composition (P) to include a flame-retardant aid. Ina case where the thermoplastic resin composition (P) includes a flame-retardant aid, the content thereof is 0.5 to 20 parts by mass, and preferably 1 to 10 parts by mass, per 100 parts by mass of the thermoplastic resin composition (P). When the content of the flame-retardant aid is the above lower limit value or more, it is possible to obtain a sufficient synergistic effect with the flame retardant. When the content of the flame-retardant aid is the above upper limit value or less, it is possible to improve the mechanical properties of the thermoplastic resin member 301 to be obtained. Examples of flame-retardant aids include antimony trioxide ($Sb_2O_3$), antimony pentoxide ($Sb_2O_5$), and the like.

The thermoplastic resin composition (P) preferably has high flowability in order to facilitate penetration into the fine concavo-convex structure imparted to the surface of the metal member (M). Therefore, in the present embodiment, the thermoplastic resin composition (P) preferably has an MFR of 1 to 200 g/10 min as measured under conditions of a load of 2.16 kg at 230° C. in accordance with ASTM D 1238, and more preferably 5 to 50 g/10 min.

(Method for Manufacturing Thermoplastic Resin Composition (P))

The method for manufacturing the thermoplastic resin composition (P) is not particularly limited, and manufacturing is possible using a known method. Examples thereof include the following methods. First, the thermoplastic resin composition (P) is obtained by mixing or melting and mixing the thermoplastic resin (P1) and other blending agents (P2) as necessary, using a mixing device such as a Banbury mixer, a single screw extruder, a twin-screw extruder, or a high-speed twin screw extruder.

[Method for Manufacturing Electronic Device Housing]

Next, a description will be given of a method for manufacturing the electronic device housing 100 according to the present embodiment.

Figure 5:
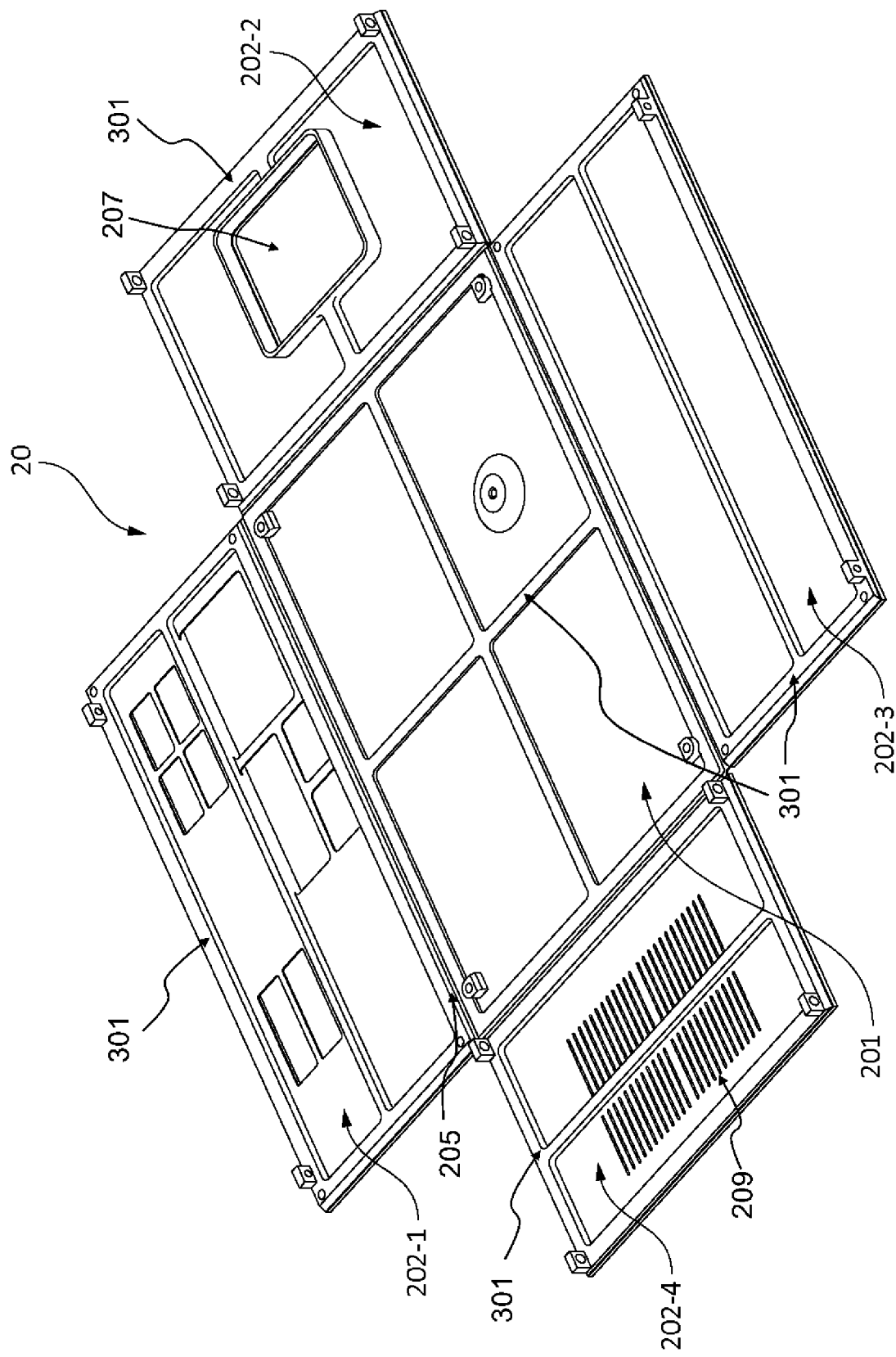
FIG. 5 is a perspective view schematically showing an example of a structure of a development plan-shaped metal plate (development plan-shaped metal resin joint plate) to which a thermoplastic resin member of an embodiment according to the present invention is joined.

FIG. 3, FIG. 4, and FIG. 5 are perspective views schematically showing an example of the structure of a development plan-shaped metal plate (a development plan-shaped metal resin joint plate 20) to which the thermoplastic resin member 301 according to an embodiment of the present invention is joined.

The method for manufacturing the electronic device housing 100 according to the present embodiment includes, for example, the following steps (A) to (C).

(A) A step of preparing a development plan-shaped metal plate having a fine concavo-convex structure on at least the surface of the joined portion to which the thermoplastic resin member 301 is joined, the metal plate being provided with the metal bottom plate 201 and the metal side plates 202 (202-1, 202-2, 202-3, and 202-4) integrally connected to the metal bottom plate 201

(B) A step of manufacturing the development plan-shaped metal resin joint plate 20 by placing a development plan-shaped metal plate in a metal mold and injecting the thermoplastic resin composition (P) into the metal mold to join the thermoplastic resin member 301 to the surface of the development plan-shaped metal plate (C) A step of forming the development plan-shaped metal resin joint plate 20 into a box shape by folding the boundary linear portions 205 between the bottom plate 201 and the side plates 202 of the development plan-shaped metal resin joint plate 20

In the method for manufacturing the electronic device housing 100 according to the present embodiment, since the shape of the development plan-shaped metal plate, which is an intermediate product before the folding processing, or the development plan-shaped metal resin joint plate 20 is a flat plate shape, there is an advantage in that the storage efficiency and the transportation efficiency of large amounts of the intermediate product are improved.

(Step (A))

First, a development plan-shaped metal plate is prepared which has the development plan shape of the electronic device housing 100 having a fine concavo-convex structure on at least the surface of the joined portion to which the thermoplastic resin member 301 is joined, the metal plate being provided with the metal bottom plate 201 and the metal side plates 202 (202-1, 202-2, 202-3, and 202-4) integrally connected to the metal bottom plate 201. Here, as shown in FIG. 3, the development plan-shaped metal plate may be further provided with the metal lid plate 203 integrally connected to one side plate 202, or the lid plate 203 may not be provided as shown in FIG. 5. In addition, as shown in FIG. 4, one side plate (rear plate) 202-3 may not be provided. In a case where the lid plate 203 is not provided, the lid plate 203 shown in FIG. 2 is separately prepared and it is possible to engage the lid plate 203 with one side plate 202 by, for example, the above mechanical engagement means. Similarly, in a case where the rear plate 202-3 is not provided, the rear plate 202-3 (not shown) is separately prepared and is able to be engaged with the surface formed of the bottom plate 201, both the side plates 202-2 and 202-4, and the lid plate 203, for example, by the mechanical engagement means.

Here, the development plan-shaped metal plate corresponds to the metal member (M) forming the electronic device housing 100 and it is possible to obtain the development plan shaped metal plate by, for example, processing the metal member into a development plan shape shown in FIGS. 3, 4, and 5 and carrying out the roughening treatment on the surface of the joined portion to which at least the thermoplastic resin member 301 is joined.

The details of the metal member and the roughening treatment are omitted here.

(Step (B))

Next, the development plan-shaped metal plate is placed in a metal mold, and the thermoplastic resin composition (P) is injected into the metal mold to join the thermoplastic resin member 301 to the surface of the development plan-shaped metal plate.

Examples of methods for joining the thermoplastic resin member 301 include an injection molding method, a transfer molding method, a compression molding method, a reaction injection molding method, a blow molding method, a thermoforming method, a press molding method, and the like. Among these, the injection molding method is preferable. That is, the thermoplastic resin member 301 is preferably an injection molded body. A description will be given below of an example using the injection molding method.

The method of joining the thermoplastic resin member 301 to the development plan-shaped metal plate using the injection molding method includes, for example, the following steps (i) and (ii).

(i) A step of arranging the development plan-shaped metal plate in an injection molding metal mold (ii) A step of injection-molding the thermoplastic resin composition (P) into the metal mold and forming the thermoplastic resin member 301 such that at least a portion of the thermoplastic resin member 301 comes into contact with the development plan-shaped metal plate These will be described in detail below.

First, (i) an injection molding metal mold is prepared, the metal mold is opened, and the development plan-shaped metal plate is arranged in the cavity portion (space portion).

(ii) Thereafter, the metal mold is closed, and the thermoplastic resin composition (P) is injected into the cavity portion of the metal mold and solidified such that at least a portion of the thermoplastic resin member 301 comes into contact with the development plan-shaped metal plate and joins the development plan-shaped metal plate and the thermoplastic resin member 301. Thereafter, opening and releasing the metal mold makes it possible to obtain the development plan-shaped metal resin joint plate 20 in which the thermoplastic resin member 301 is joined to the development plan-shaped metal plate. As the metal mold, for example, it is possible to use an injection molding metal mold generally used in high-speed heat cycle molding (RHCM, heat and cool molding).

Here, in the step (ii), during the period from the start of injection of the thermoplastic resin composition (P) to the end of pressurization, the surface temperature of the metal mold is preferably maintained at a temperature which is equal to or higher than the glass transition temperature (also referred to below as Tg) of the thermoplastic resin member 301 and more preferably at a temperature of Tg+(5 or more and 100 or less) ° C. or higher.

Due to this, it is possible to bring the thermoplastic resin composition (P) into contact with the surface of the development plan-shaped metal plate at a high pressure for a longer time while maintaining the thermoplastic resin composition (P) in a softened state.

As a result, since it is possible to improve the adhesion between the development plan-shaped metal plate and the thermoplastic resin member 301, it is possible to more stably obtain the electronic device housing 100 which is superior in joining strength.

In addition, in the step (ii), after the end of the pressurization, the surface temperature of the metal mold is preferably cooled to a temperature lower than the glass transition temperature of the thermoplastic resin member 301, and more preferably Tg−(5 or more to 100 or less) ° C. or lower.

Due to this, it is possible to rapidly solidify the thermoplastic resin member 301 in a softened state. As a result, since it is possible to shorten the molding cycle of the electronic device housing 100, it is possible to efficiently obtain the electronic device housing 100.

It is possible to carry out adjustment of the surface temperature of the metal mold by connecting a rapid heating and cooling apparatus to the metal mold. As the rapid heating and cooling apparatus, it is possible to adopt a generally used system.

As a heating method, any one of steam type, pressurized hydrothermal type, hydrothermal type, hot oil type, electric heater type, electromagnetic induction heating type or a combination of a plurality thereof may be used.

Specifically, the surface temperature of the metal mold is preferably maintained at a temperature equal to or higher than the glass transition temperature of the thermoplastic resin member 301 by introducing a heating medium selected from steam, warm water, and warm oil into a flow path provided near the surface of the metal mold, or by using electromagnetic induction heating.

As a cooling method, any one of a cold-water type, a cold oil type, or a combination thereof may be used.

Specifically, the surface temperature of the metal mold is preferably cooled to a temperature lower than the glass transition temperature of the thermoplastic resin member 301 by introducing a cooling medium selected from cold water and cold oil into a flow path provided near the surface of the metal mold.

In the step (ii), the time from the start of injection to the end of the pressurization is preferably 1 second or more and 60 seconds or less, and more preferably 10 seconds or more and 50 seconds or less.

When the above time is the above lower limit value or more, it is possible to bring the thermoplastic resin member 301 into contact with the fine concavo-convex structure of the development plan-shaped metal plate at a high pressure for a longer time while maintaining the thermoplastic resin member 301 in a molten state. Due to this, it is possible to more stably obtain the electronic device housing 100 which is superior in joining strength.

In addition, when the time is the upper limit value or less, since it is possible to shorten the molding cycle of the electronic device housing 100, it is possible to obtain the electronic device housing 100 more efficiently.

In the method for manufacturing the electronic device housing 100 according to the present embodiment, in the step (B), the thermoplastic resin composition (P) is preferably injected into the metal mold such that the thermoplastic resin member 301 is not joined to the boundary linear portion 205 between the bottom plate 201 and the side plate 202.

By doing so, it is possible to obtain the development plan-shaped metal resin joint plate 20 in which the thermoplastic resin member 301 is not joined to the boundary linear portion 205 between the bottom plate 201 and the side plate 202, and as a result, it is easier to fold the boundary linear portion 205 between the bottom plate 201 and the side plate 202, and easier to form the development plan-shaped metal resin joint plate 20 into a box shape. Therefore, it is possible to further improve the productivity of the electronic device housing 100.

(Step (C))

Next, the boundary linear portion 205 between the bottom plate 201 and the side plate 202 is folded to form the development plan-shaped metal resin joint plate 20 into a box shape, thereby obtaining the electronic device housing 100.

The method for forming the development plan-shaped metal resin joint plate 20 into a box shape is not particularly limited, and it is possible to use generally known methods. For example, the electronic device housing 100 is obtained by folding the boundary linear portions 205 between the bottom plate 201 and the side plates 202 and attaching the lid plate 203 as necessary.

At this time, adjacent side plates 202 and the lid plate 203 connected with the side plates 202 as necessary may be engaged by mechanical means. The mechanical engagement means is not particularly limited, but examples thereof include screw fastening or the like.

Although embodiments of the present invention are described above, these are examples of the present invention, and it is also possible to adopt various configurations other than those described above.

EXAMPLES

Figure 6:
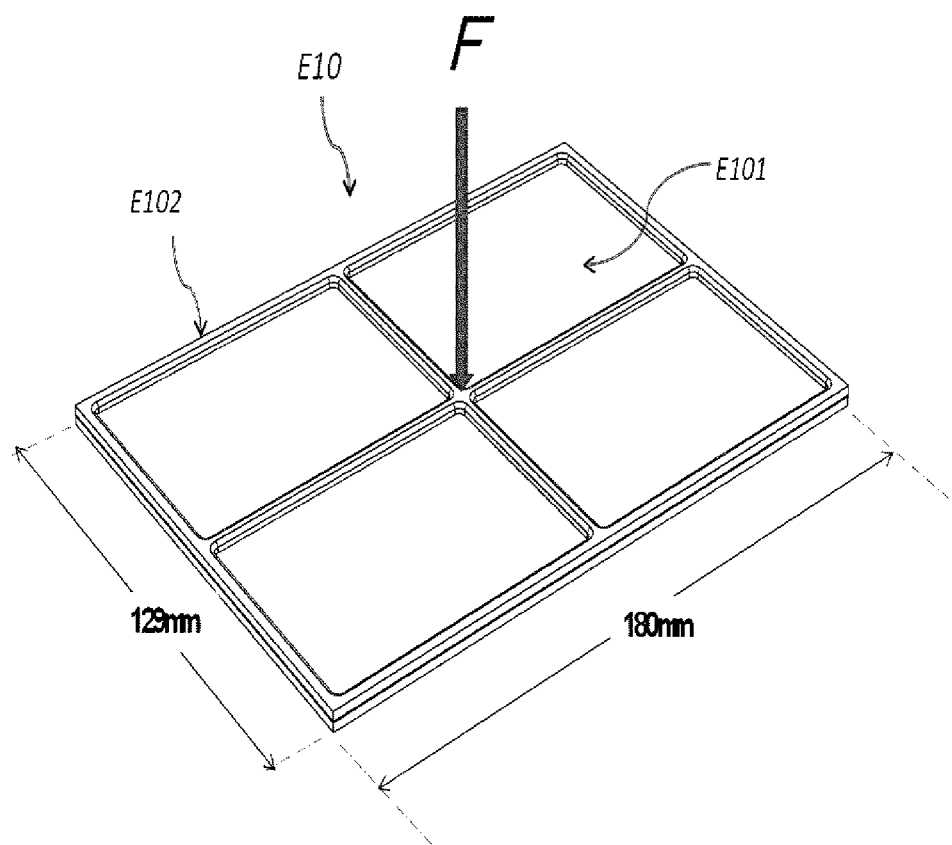
FIG. 6 is a perspective view of a metal resin joint plate for evaluating mechanical characteristics used in Example 1.
Figure 7:
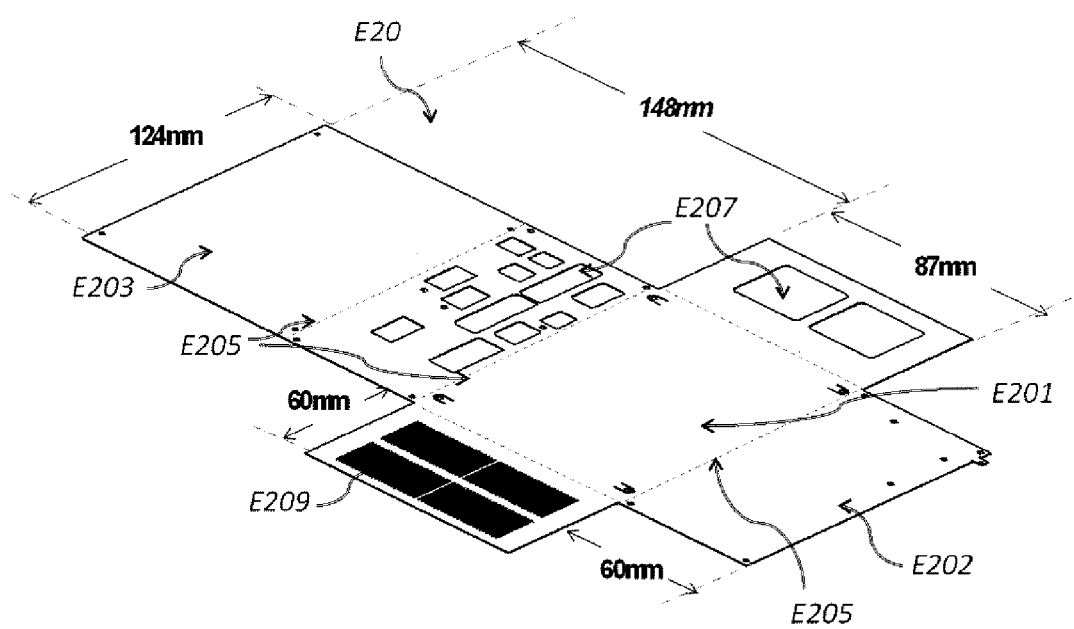
FIG. 7 is a perspective view of a development plan-shaped metal plate according to Example 2.
Figure 8:
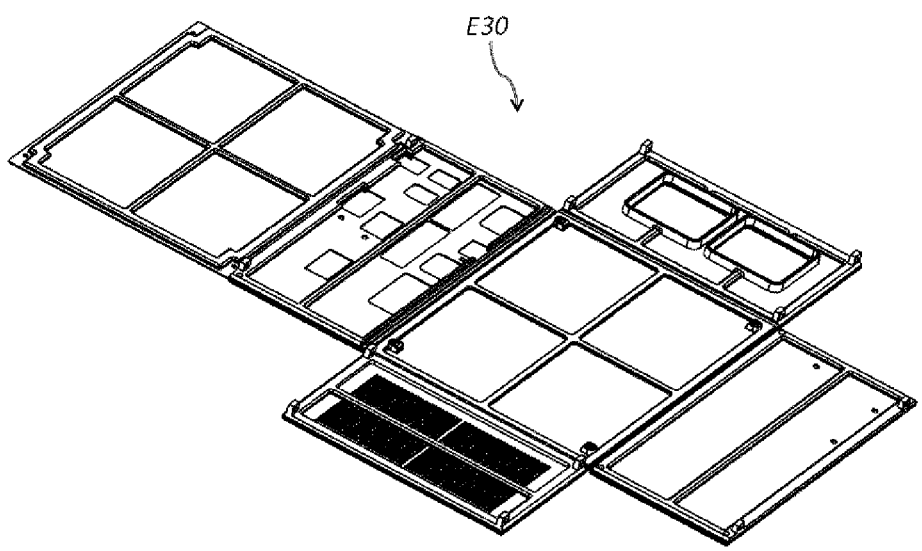
FIG. 8 is a perspective view of a development plan-shaped metal resin joint plate according to Example 2.

A detailed description will be given below of the present embodiment with reference to Examples and Comparative Examples. The present embodiment is not at all limited to the description of these Examples. FIG. 6, FIG. 7, and FIG. 8 are used as illustrations for illustrating these Examples.

Example 1

In Example 1, attention is given to a metal resin joint plate forming a portion of the electronic device housing according to the present embodiment. The metal member forming the metal resin joint plate was formed of an aluminum alloy and the thermoplastic resin member was joined to both surfaces of the metal member to produce a metal resin joint plate E10. Next, the results of experiments are shown in which metal resin joint plate E10 exhibits a high weight reduction effect while maintaining a strength comparable to that of the metal plate used in Comparative Example 1 formed only of a steel plate (SECC) which is a known technology.

(Manufacturing of Roughened Aluminum Alloy Plate E101 Which is Metal Member Which Forms Metal Resin Joint Plate E10)

An aluminum alloy plate (alloy No. 5052 defined in JIS H 4000) having a shape of 180 mm (lateral width)×129 mm (longitudinal width)×0.3 mm (thickness) was prepared. In this aluminum alloy plate, a plurality of small holes (not shown) for resin penetration are provided such that the resin is able to flow and communicate from the fixed side (cavity side) to the movable side (core side).

Next, the aluminum alloy plate was subjected to a degreasing treatment with a commercially available degreasing agent, then immersed for three minutes in a treatment tank 1 filled with an alkaline etching agent (30° C.) containing 15 mass % of sodium hydroxide and 3 mass % of zinc oxide (may be abbreviated as "alkali-based etching agent treatment" in the following description), then immersed for 1 minute in 30 mass % of nitric acid (30° C.), and then the alkali-based etching agent treatment was repeated one more time. Next, the obtained aluminum alloy plate was immersed and oscillated for 5 minutes at 30° C. in a treatment tank 2 filled with an aqueous acid etching solution containing 3.9 mass % of ferric chloride, 0.2 mass % of cupric chloride, and 4.1 mass % of sulfuric acid (in the following description, may be abbreviated as "acid-based etching agent treatment"). Next, ultrasonic cleaning (under water for 1 minute) was performed with flowing water, and then drying was carried out to obtain the roughened aluminum alloy plate E101.

For the surface roughness of the obtained roughened aluminum alloy plate E101, each of the load length ratio (Rmr) of the roughness curve, the ten-point average roughness (Rz), and the average length (RSm) of the roughness curve element is measured among the surface roughness's to be measured in accordance with JIS B 0601 (corresponding to international standard: ISO 4287) using a surface roughness measuring device "Surfcom 1400 D (manufactured by Tokyo Seimitsu Co., Ltd.)". The obtained results are shown below. As shown in FIG. 9, the measurement places are a total of six linear portions formed of three arbitrary linear portions on the fine concavo-convex surface of the roughened aluminum alloy plate E101 and three arbitrary linear portions orthogonal to the linear portions.

Load length ratio (Rmr) of the roughness curve at a cutting level of 20% and an evaluation length of 4 mm: longitudinal 3 points=6.4%/4.0%/3.7%, lateral 3 points=6.9%/2.0%/6.4%

Load length ratio (Rmr) of the roughness curve at a cutting level of 40% and an evaluation length of 4 mm: longitudinal 3 points: 28.5%/28.3%/26.5%, lateral 3 points=38.5%/18.4%/19.3%

Ten-point average roughness (Rz): longitudinal 3 points=17.0 μm/18.4 μm/16.6 μm, lateral 3 points=17.9 μm/18.0 μm/19.8 μm Average length (RSm) of the roughness curve element: longitudinal 3 points=120 μm/165 μm/127 μm, lateral 3 points=119 μm/145 μm/156 μm (Manufacturing of Metal Resin Joint Plate E10 by Insert Molding)

A dedicated metal insert mold was attached to an injection molding machine (JSW J 400 AD 110 H) manufactured by Japan Steel Works, Ltd., and the roughened aluminum alloy plate E101 obtained by the above method was set in the metal mold. Next, as the thermoplastic resin composition in the metal mold, glass fiber-reinforced polypropylene (80 parts by mass of V7100 manufactured by Prime Polymer Co., Ltd., polypropylene (230° C., MFR under a load of 2.16 kg=18 g/10 minutes) and 20 parts by mass of glass fiber) was subjected to injection molding under the conditions of a cylinder temperature of 230° C., a metal mold temperature of 55° C., an injection speed of 100 mm/sec, pressurization of 15 MPa, a pressurization time of 5 seconds, and a cooling time of 50 seconds to manufacture the metal resin joint plate E10. In the metal resin joint plate E10, all the thermoplastic resin members E102 are joined so as to face both surfaces of the roughened aluminum alloy plate E101. The width of the joined thermoplastic resin member (may be referred to below as a resin rib portion) was commonly 3.6 mm and the height of the resin rib portion was commonly 2.1 mm. The total weight of the metal resin joint plate E10 was 39.6 g.

In addition, the joined portion area ratio was 14 area %.

(Measurement of Displacement Amount in Folding Test)

The result of measuring (25° C.) the displacement amount of a case (reference symbol F in FIG. 6) where stress of 2 kgf was applied in the vertical direction to the center portion of the metal resin joint plate E10 using a fold-deflection measuring instrument autograph manufactured by Shimadzu Corporation was 1.8 mm.

Comparative Example 1

The thickness of a known material (zinc plated steel plate: SECC) exhibiting same displacement amount (1.8 mm) as the metal resin joint plate E10 obtained in Example 1 when a stress of 2 kgf was applied with the same method as in the displacement amount measurement of Example 1 was determined. That is, as a result of measuring a displacement amount when a buoyant force of 2 kgf was applied to a commercially available SECC material having the same longitudinal and lateral dimensions as those of the aluminum alloy plate used in Example 1 and different only in thickness, it was found that SECC having a thickness of 0.8 mm exhibited the same displacement amount (1.8 mm) as the metal resin joint plate E10 obtained in Example 1. The total weight of this SECC plate was 146.2 g.

A comparison will be made between Example 1 and Comparative Example 1.

It was found that the metal resin joint plate E10 according to the present embodiment achieves a weight reduction of approximately 73% despite exhibiting the same displacement amount under a constant load as compared with the SECC plate which is a known material.

Example 2

(Manufacturing of Roughened Aluminum Alloy Plate E20 Which is Metal Member Which Forms Development Plan-Shaped Metal Resin Joint Plate E30)

A commercially available 0.3 mm thick aluminum alloy plate (alloy No. 5052 defined in JIS H 4000) was cut into the shape (unit: mm) shown in FIG. 7 and sheet metal processing or the like was performed to provide an opening portion E207 and a slit portion E209 shown in FIG. 7. In addition, a plurality of small holes (not shown) for resin penetration are provided in this aluminum alloy plate (base plate) such that the resin is able to flow and communicate from the fixed side (cavity side) to the movable side (core side). The number of small holes for resin penetration is not particularly limited, but is usually 2 to 5 with 1 per side plate and lid plate.

Next, the above aluminum alloy plate was subjected to a surface roughening treatment in exactly the same manner as in the method shown in Example 1 to obtain a roughened aluminum alloy plate E20 having a bottom plate E201, a side plate E202, and a lid plate E203.

For the surface roughness of the obtained roughened aluminum alloy plate E20, each of the load length ratio (Rmr) of the roughness curve, the ten-point average roughness (Rz), and the average length (RSm) of the roughness curve element was measured among the surface roughness's measured in accordance with JIS B 0601 (corresponding to international standard: ISO 4287) using a surface roughness measuring device "Surfcom 1400 D (manufactured by Tokyo Seimitsu Co., Ltd.)". As a result, it was confirmed that values reproducing the surface roughness parameters shown in Example 1 are exhibited.

(Manufacturing of Development Plan-shaped Metal Resin Joint Plate E30 by Insert Molding)

A dedicated metal insert mold was attached to an injection molding machine (JSW J 400 AD 110 H) manufactured by Japan Steel Works, Ltd., and the roughened aluminum alloy plate E20 obtained by the above method was set in the metal mold. Next, as the thermoplastic resin composition in the metal mold, glass fiber-reinforced polypropylene (80 parts by mass of V7100 manufactured by Prime Polymer Co., Ltd., polypropylene (230° C., MFR under a load of 2.16 kg=18 g/10 minutes) and 20 parts by mass of glass fiber) was subjected to injection molding under the conditions of a cylinder temperature of 230° C., a metal mold temperature of 55° C., an injection speed of 100 mm/sec, pressurization of 15 MPa, a pressurization time of 5 seconds, and a cooling time of 50 seconds to manufacture the development plan-shaped metal resin joint plate E30 as shown in FIG. 8. As shown in FIG. 8, it was confirmed that thermoplastic resin members were joined to both surfaces of the roughened aluminum alloy plate E20 (in FIG. 8, the resin portion on the rear surface side is not shown). Although not shown in FIG. 8, convex portions (claw portions) and concave portions are formed at arbitrary places on the thermoplastic resin member such that it is possible for the lid plate and the side plates to snap fit with each other.

(Manufacturing of Electronic Device Housing by Folding Boundary Linear Portions)

The box-shaped electronic device housing was prepared by folding each boundary linear portion E205 of the obtained development plan-shaped metal resin joint plate E30 inward into a right angle and then snap-fitting the convex portions and the concave portions provided in the resin portion together. No warpage or peeling of the metal and resin was observed at all in this electronic device housing. This housing was subjected to a heat cycle test in a heat cycle test machine (test conditions: holding for 2 hours at −20° C., then holding at 80° C. for 2 hours, then a heat cycle of heating and cooling for 1 hour each, repeated for 7 days, 4 times a day), and, as a result, the metal member and the thermoplastic resin member were maintained in a state of being firmly joined, and no generation of warping or peeling phenomena was observed at all.

In addition, the joined portion area ratio was 21 area %.

Comparative Example 2

The same operation was performed under the same conditions as in Example 2 except that an aluminum alloy plate (base plate) having no small holes for resin penetration was used. A development plan-shaped metal resin joint plate in which the thermoplastic resin composition was joined only to the fixed side (cavity side) of the development plan-shaped metal plate was obtained by means of insert molding. Peeling of parts of the metal member and the thermoplastic resin member was already visually observed immediately after molding. A development plan-shaped metal resin joint plate in which resin was joined only to one side was folded in the same manner as in Example 2 to form a box shape. At this time, the joined thermoplastic resin member was folded so as to be inside the box. Next, this electronic device housing was subjected to a heat cycle test in the same manner as in Example 2. As a result, it was confirmed that each surface of the bottom plate, all the side plates, and the lid plate were deformed into a convex shape, most of the joined portion (90% or more of the total area of the joined portion) between the metal member and the thermoplastic resin member was peeled off, and gaps were formed due to the boundary lines connecting the sides of each surface being deformed.

This application claims priority based on Japanese Patent Application No. 2016-165527 filed on Aug. 26, 2016 and claims priority based on Japanese Patent Application No. 2017-010265 filed on Jan. 24, 2017, the disclosures thereof which are incorporated herein in their entirety.

The present invention also includes the following aspects.

[Appendix 1]

An electronic device housing for internally accommodating an electronic device, the housing including a metal bottom plate; and a metal side plate folded and integrally connected to the bottom plate, in which, in a metal member (M) formed of at least the bottom plate and the side plate, a thermoplastic resin member is joined to at least a portion of a surface of the metal member (M) and the metal member (M) is reinforced by the thermoplastic resin member.

[Appendix 2]

The electronic device housing according to appendix 1, in which the metal member (M) has an average thickness of 0.2 mm or more and 1.0 mm or less.

[Appendix 3]

The electronic device housing according to appendix 1 or 2, in which the metal member (M) has a fine concavo-convex structure on at least a surface of a joined portion with the thermoplastic resin member, and the metal member (M) and the thermoplastic resin member are joined by a portion of the thermoplastic resin member penetrating into the fine concavo-convex structure.

[Appendix 4]

The electronic device housing according to any one of appendixs 1 to 3, in which the thermoplastic resin member is joined to both surfaces of the metal member (M).

[Appendix 5]

The electronic device housing according to appendix 4, in which the thermoplastic resin member joined to one surface of the metal member (M) and the thermoplastic resin member joined to the other surface are arranged at the same position so as to face each other in a vertical direction of the plate surface of the metal member (M).

[Appendix 6]

The electronic device housing according to any one of appendixs 1 to 5, in which the thermoplastic resin member is joined to at least a peripheral edge portion of a surface of the metal member (M).

[Appendix 7]

The electronic device housing according to any one of appendixs 1 to 6, in which the metal material forming the metal member (M) includes a metal which has an electromagnetic wave shielding property.

[Appendix 8]

The electronic device housing according to any one of appendixs 1 to 7, in which the housing further includes a metal lid plate folded and integrally connected to the side plate, in which the thermoplastic resin member is joined to at least a portion of a surface of the lid plate, and the lid plate is reinforced by the thermoplastic resin member.

[Appendix 9]

The electronic device housing according to appendix 8, in which the lid plate has a fine concavo-convex structure on at least a surface of a joined portion with the thermoplastic resin member, and the lid plate and the thermoplastic resin member are joined by allowing a portion of the thermoplastic resin member to penetrate into the fine concavo-convex structure.

[Appendix 10]

The electronic device housing according to any one of appendixs 1 to 9, in which the thermoplastic resin member is not joined to a boundary linear portion between the bottom plate and the side plate.

[Appendix 11]

A method for manufacturing for manufacturing the electronic device housing according to anyone of appendixs 1 to 10, the method including a step (A) of preparing a development plan-shaped metal plate provided with a metal bottom plate and a metal side plate integrally connected to the bottom plate, and having a fine concavo-convex structure on at least a joined portion surface to which the thermoplastic resin member is joined; a step (B) of placing the development plan-shaped metal plate in a metal mold, injecting a thermoplastic resin composition into the metal mold, and joining a thermoplastic resin member to a surface of the development plan-shaped metal plate; and a step (C) of forming the development plan-shaped metal plate to which the thermoplastic resin member is joined into a box shape by folding boundary linear portions between the bottom plate and the side plates.

[Appendix 12]

The method for manufacturing an electronic device housing according to appendix 11, in which, in the step (B), the thermoplastic resin composition is injected into the metal mold such that the thermoplastic resin member is not joined to a boundary linear portion between the bottom plate and the side plate.

The invention claimed is:

1. An electronic device housing for internally accommodating an electronic device, the housing comprising:
   a metal bottom plate; and
   a metal side plate folded and integrally connected to the bottom plate,
   wherein, in a metal member (M) formed of at least the bottom plate and the side plate, a thermoplastic resin member is joined to a portion of a surface of the plate-shaped metal member (M) and the metal member (M) is reinforced by the thermoplastic resin member, and
   the thermoplastic resin member is joined to both surfaces of the plate-shaped metal member (M), and
   wherein at least a portion of the thermoplastic resin member is formed in a frame shape on the surface of the metal member (M),
   wherein the metal member (M) has a fine concavo-convex structure on at least a surface of a joined portion with the thermoplastic resin member, and
   the metal member (M) and the thermoplastic resin member are joined by allowing a portion of the thermoplastic resin member to penetrate into the fine concavo-convex structure, and
   the fine concavo-convex structure on the surface of the metal member (M) is a fine concavo-convex structure in which convex portions having a spacing period of 5 nm or more and 500 μm or less stand close together,
   wherein a surface area of the joined portion of the thermoplastic resin member occupied in an entire surface area of the metal member (M) is 1 area % or more and 50 area % or less, and
   wherein the frame shape is at least one kind of shape selected from a bracing shape, a lattice shape, a truss shape, and a Rahmen shape.

2. The electronic device housing according to claim 1, wherein the metal member (M) has an average thickness of 0.2 mm or more and 1.0 mm or less.

3. The electronic device housing according to claim 1, wherein the thermoplastic resin member joined to one surface of the plate-shaped metal member (M) and at least a portion of the thermoplastic resin member joined to another surface are arranged to face each other in a vertical direction of a plate surface of the metal member (M).

4. The electronic device housing according to claim 1, wherein the thermoplastic resin member is joined to at least a peripheral edge portion of the surface of the metal member (M).

5. The electronic device housing according to claim 1, wherein the thermoplastic resin member includes an injection molded body.

6. The electronic device housing according to claim 1, wherein the thermoplastic resin member has an average thickness of 1.0 mm or more and 10 mm or less.

7. The electronic device housing according to claim 1, wherein a metal material forming the metal member (M) includes a metal which has an electromagnetic wave shielding property.

8. The electronic device housing according to claim 1, the housing further comprising:
   a metal lid plate folded and integrally connected to the side plate,
   wherein the thermoplastic resin member is joined to a portion of a surface of the lid plate, and the lid plate is reinforced by the thermoplastic resin member.

9. The electronic device housing according to claim 8, wherein the lid plate has a fine concavo-convex structure on at least a surface of a joined portion with the thermoplastic resin member, and
   the lid plate and the thermoplastic resin member are joined by allowing a portion of the thermoplastic resin member to penetrate into the fine concavo-convex structure.

10. The electronic device housing according to claim 1, wherein the thermoplastic resin member is not joined to a boundary linear portion between the bottom plate and the side plate.

11. A method for manufacturing the electronic device housing according to claim 1, the method comprising:
    a step (A) of preparing a development plan-shaped metal plate provided with a metal bottom plate and a metal side plate integrally connected to the bottom plate, and having a fine concavo-convex structure on at least a surface of a joined portion to which a thermoplastic resin member is joined;
    a step (B) of manufacturing a development plan-shaped metal resin joint plate by installing the development plan-shaped metal plate in a metal mold, injecting a thermoplastic resin composition into the metal mold, and joining the thermoplastic resin member to a surface of the development plan-shaped metal plate; and
    a step (C) of forming the development plan-shaped metal resin joint plate into a box shape by folding a boundary linear portion between the bottom plate and the side plate of the development plan-shaped metal resin joint plate.

12. The method for manufacturing the electronic device housing according to claim 11,
    wherein, in the step (B), the thermoplastic resin composition is injected into the metal mold such that the thermoplastic resin member is not joined to the boundary linear portion between the bottom plate and the side plate.

13. An electronic apparatus comprising:
the electronic device housing according to claim 1; and
an electronic device accommodated in the electronic device housing.

14. A development plan-shaped metal resin joint plate for manufacturing a housing for internally accommodating an electronic device, the development plan-shaped metal resin joint plate including a metal bottom plate, and a metal side plate folded and integrally connected to the bottom plate,
wherein, in a metal member (M) formed of at least the bottom plate and the side plate, a thermoplastic resin member is joined to a portion of a surface of the plate-shaped metal member (M), and the metal member (M) is reinforced by the thermoplastic resin member,
wherein the thermoplastic resin member is joined to both surfaces of the plate-shaped metal member (M), and
wherein at least a portion of the thermoplastic resin member is formed in a frame shape on the surface of the metal member (M),
wherein the metal member (M) has a fine concavo-convex structure on at least a surface of a joined portion with the thermoplastic resin member, and
the metal member (M) and the thermoplastic resin member are joined by allowing a portion of the thermoplastic resin member to penetrate into the fine concavo-convex structure, and
the fine concavo-convex structure on the surface of the metal member (M) is a fine concavo-convex structure in which convex portions having a spacing period of 5 nm or more and 500 μm or less stand close together,
wherein a surface area of the joined portion of the thermoplastic resin member occupied in an entire surface area of the metal member (M) is 1 area % or more and 50 area % or less, and
wherein the frame shape is at least one kind of shape selected from a bracing shape, a lattice shape, a truss shape, and a Rahmen shape.

* * * * *